United States Patent
Hirono

(10) Patent No.: US 11,566,939 B2
(45) Date of Patent: Jan. 31, 2023

(54) MEASUREMENT DEVICE, DISTANCE MEASUREMENT DEVICE, ELECTRONIC DEVICE, AND MEASUREMENT METHOD

(71) Applicant: SONY SEMICONDUCTOR SOLUTIONS CORPORATION, Kanagawa (JP)

(72) Inventor: Daisuke Hirono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/431,574

(22) PCT Filed: Feb. 18, 2020

(86) PCT No.: PCT/JP2020/006377
§ 371 (c)(1),
(2) Date: Aug. 17, 2021

(87) PCT Pub. No.: WO2020/175251
PCT Pub. Date: Sep. 3, 2020

(65) Prior Publication Data
US 2022/0136896 A1 May 5, 2022

(30) Foreign Application Priority Data

Feb. 27, 2019 (JP) .............................. JP2019-034949

(51) Int. Cl.
*G01J 1/44* (2006.01)
*H01L 31/02* (2006.01)
*H01L 31/107* (2006.01)

(52) U.S. Cl.
CPC .......... *G01J 1/44* (2013.01); *H01L 31/02027* (2013.01); *H01L 31/107* (2013.01); *G01J 2001/4466* (2013.01)

(58) Field of Classification Search
CPC ................ G01J 1/44; G01J 2001/4466; H01L 31/02027; H01L 31/107
See application file for complete search history.

(56) References Cited

U.S. PATENT DOCUMENTS

| | | |
|---|---|---|
| 2008/0231339 A1 | 9/2008 | Deschamps |
| 2008/0290259 A1 | 11/2008 | Mathewson et al. |

(Continued)

FOREIGN PATENT DOCUMENTS

| | | |
|---|---|---|
| AT | 527526 T | 10/2011 |
| CA | 2681765 A1 | 10/2008 |

(Continued)

OTHER PUBLICATIONS

International Search Report and Written Opinion of PCT Application No. PCT/JP2020/006377, dated Mar. 24, 2020, 10 pages of ISRWO.

*Primary Examiner* — Georgia Y Epps
*Assistant Examiner* — Don J Williams
(74) *Attorney, Agent, or Firm* — Chip Law Group

(57) ABSTRACT

A measurement device according to an embodiment includes: a light receiving element (1000) that has flow of current caused by an avalanche multiplication caused according to a photon incidence while being charged to a predetermined potential and is returned to the charged state by a recharge current, a detection unit (1002) that is configured to detect the current and invert an output signal when the current crosses a threshold value, a delay unit (210₁, 210₂) that is configured to delay timing of the inversion detected by the detection unit, according to a clock, and a control unit (201*a*) that is configured to control an operation of the light receiving element, based on the timing of the inversion delayed by the delay unit.

13 Claims, 19 Drawing Sheets

(56) References Cited

U.S. PATENT DOCUMENTS

2017/0230037 A1  8/2017 Dandin
2022/0075033 A1* 3/2022 Shinozuka ............ G01S 7/4863

FOREIGN PATENT DOCUMENTS

| | | | |
|---|---|---|---|
| CN | 110462846 | A | 11/2019 |
| GB | 2426575 | A | 11/2006 |
| JP | 2006-179587 | A | 7/2006 |
| JP | 2008-542706 | A | 11/2008 |
| JP | 2009-238935 | A | 10/2009 |
| JP | 2010-521825 | A | 6/2010 |
| JP | 2012-060012 | A | 3/2012 |
| JP | 2018-044923 | A | 3/2018 |
| JP | 2018-164029 | A | 10/2018 |
| WO | 2006/126026 | A1 | 11/2006 |
| WO | 2008/116292 | A1 | 10/2008 |
| WO | 2018/181307 | A1 | 10/2018 |

* cited by examiner

US 11,566,939 B2

MEASUREMENT DEVICE, DISTANCE MEASUREMENT DEVICE, ELECTRONIC DEVICE, AND MEASUREMENT METHOD

CROSS REFERENCE TO RELATED APPLICATIONS

This application is a U.S. National Phase of International Patent Application No. PCT/JP2020/006377 filed on Feb. 18, 2020, which claims priority benefit of Japanese Patent Application No. JP 2019-034949 filed in the Japan Patent Office on Feb. 27, 2019. Each of the above-referenced applications is hereby incorporated herein by reference in its entirety.

FIELD

The present invention relates to a measurement device, a distance measurement device, an electronic device, and a measurement method.

BACKGROUND

There is known a light receiving element that is configured to convert received light into an electric signal by photoelectric conversion to output the electric signal. As one of such light receiving elements, a single photon avalanche diode (hereinafter, referred to as SPAD) is known that is configured to obtain a large current in response to incidence of one photon by avalanche multiplication. Use of this characteristic of the SPAD makes it possible to detect incidence of one photon with high sensitivity.

The outline of a photon detection operation by the SPAD will be described. For example, a current source to which power supply voltage Vdd is supplied and whose output current is controlled on the basis of reference voltage Vref is connected to a cathode of the SPAD. An anode of the SPAD gives a large negative voltage (−Vbd) at which the avalanche multiplication occurs. When the photon is incident on the SPAD in this state, the avalanche multiplication begins, a current flows from the cathode of the SPAD toward the anode, a voltage drop occurs in the SPAD with the current flow, and the avalanche multiplication is stopped when an anode-cathode voltage drops to the voltage (−Vbd) (quenching operation). Then, the SPAD is charged with a current (referred to as a recharge current Id) from the current source, and the SPAD returns to the state before incidence of the photon (recharging operation).

CITATION LIST

Patent Literature

Patent Literature 1: JP 2018-044923 A

SUMMARY

Technical Problem

There is known active quenching/recharging for forcibly performing the quenching operation and the recharging operation of the SPAD according to control. In the active quenching/recharging, delay amounts of the quenching operation and the recharging operation to voltage drop generation timing of the SPAD can be determined by adjusting a drive force or load capacity of an inverter chain. The drive force and the load capacity of the inverter chain are analog elements and susceptible to process/voltage/temperature (PVT) variation, external noise, or the like.

An object of the present disclosure is to provide a measurement device, a distance measurement device, an electronic device, and a measurement method that are configured to more stably control an operation of a light receiving element.

Solution to Problem

For solving the problem described above, a measurement device according to one aspect of the present disclosure has a light receiving element that has flow of current caused by an avalanche multiplication caused according to a photon incidence while being charged to a predetermined potential and is returned to the charged state by a recharge current; a detection unit that is configured to detect the current and invert an output signal when the current crosses a threshold value; a delay unit that is configured to delay timing of the inversion detected by the detection unit, according to a clock; and a control unit that is configured to control an operation of the light receiving element, based on the timing of the inversion delayed by the delay unit.

DESCRIPTION OF EMBODIMENTS

Figure 1:
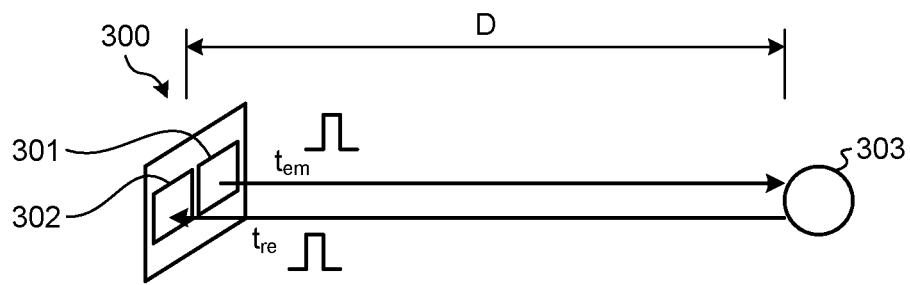
FIG. 1 is a diagram schematically illustrating distance measurement by a direct ToF method applicable to embodiments.

Embodiments of the present disclosure will be described in detail below with reference to the drawings. Note that in the following embodiments, the same portions are denoted by the same reference numerals and symbols, and redundant description thereof will be omitted.

(Configuration Common to Embodiments)

The present disclosure is suitable for use in a technology detecting a photon. Prior to the description of the embodiments of the present disclosure, for ease of understanding, as one of technologies applicable to the embodiments, a technology performing distance measurement by detecting the photon will be described. As a distance measurement method in this case, a direct time of flight (ToF) method is applied. The direct ToF method is a method of measuring a distance on the basis of a time difference between light emission timing and light reception timing, in which light emitted by a light source is reflected from an object to be measured and the reflected light is received by a light receiving element.

The distance measurement by the direct ToF method will be schematically described with reference to FIGS. 1 and 2. FIG. 1 is a diagram schematically illustrating the distance measurement by the direct ToF method applicable to the embodiments. A distance measurement device 300 includes a light source unit 301 and a light receiving unit 302. The light source unit 301 is, for example, a laser diode, and is driven to emit pulsed laser light. Light emitted from the light source unit 301 is reflected from an object 303 to be measured and the reflected light is received by the light receiving unit 302. The light receiving unit 302 includes a light receiving element configured to convert light into an electric signal by photoelectric conversion, and outputs a signal according to the received light.

Here, the time (light emission timing) at which the light source unit 301 emits light is defined as time $t_{em}$, and the time (light reception timing) at which the light receiving unit 302 receives the reflected light obtained by reflecting the light emitted by the light source unit 301 from the object 303 to be measured is defined as time $t_{re}$. Assuming that a constant c is light velocity (2.9979×10$^8$ [m/sec]), a distance D between the distance measurement device 300 and the object 303 to be measured is calculated by the following formula (1).

$$D=(c/2)\times(t_{re}-t_{em}) \quad (1)$$

The distance measurement device 300 repeatedly performs the process described above a plurality of times. The light receiving unit 302 may include a plurality of light receiving elements to calculate the distances D on the basis of light reception timing at which the reflected light is received by the light receiving elements. The distance measurement device 300 classifies time periods $t_m$ (referred to as light receiving time periods $t_m$) from the time $t_{em}$ indicating the light emission timing to the light reception timing at which the light is received by the light receiving unit 302, on the basis of intervals (bins) and generates a histogram.

Note that the light received by the light receiving unit 302 during the light receiving time period $t_n$ is not limited to the reflected light obtained by reflecting the light emitted from the light source unit 301 by the object to be measured. For example, ambient light around the distance measurement device 300 (light receiving unit 302) is also received by the light receiving unit 302.

Figure 2:
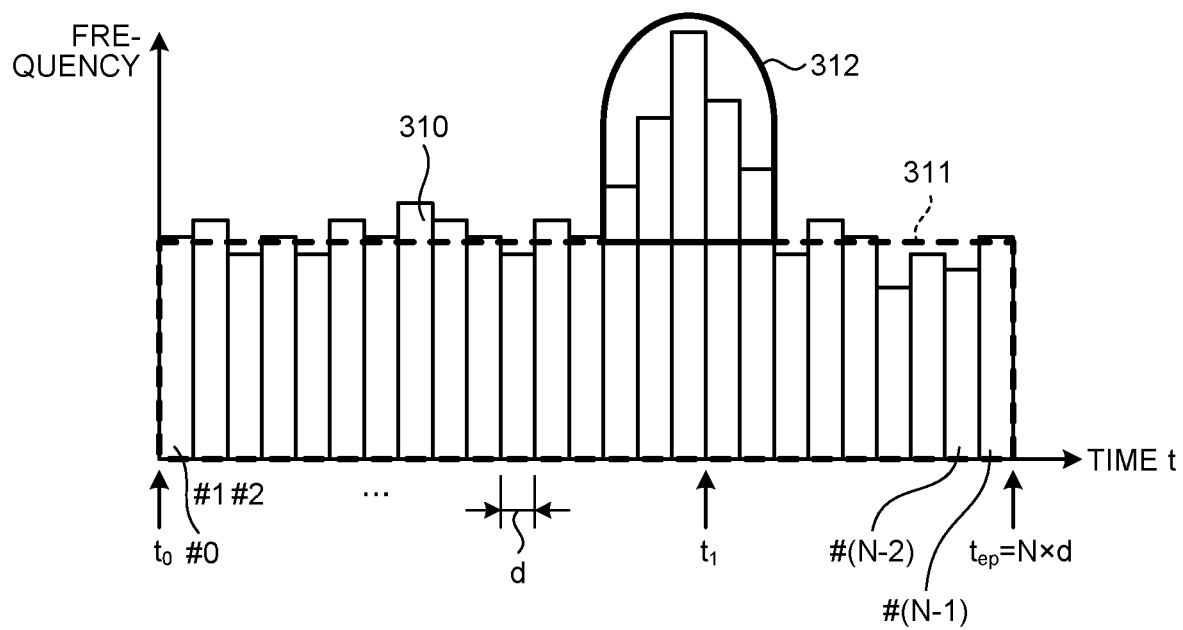
FIG. 2 is a diagram illustrating an example of a histogram based on light receiving time of a light receiving unit applicable to the embodiments.

FIG. 2 is a diagram illustrating an example of a histogram based on the light receiving time of the light receiving unit 302 applicable to the embodiments. In FIG. 2, the horizontal axis represents bins and the vertical axis represents the frequency in each bin. The bin is obtained by classifying the light receiving time periods $t_n$ into predetermined unit time intervals d. Specifically, bin #0 is $0 \leq t_m < d$, bin #1 is $d \leq t_m < 2 \times d$, bin #2 is $2 \times d \leq t_m < 3 \times d$, . . . , bin #(N−2) is $(N−2) \times d \leq t_m < (N−1) \times d$. When an exposure time of the light receiving unit 302 is time $t_{ep}$, $t_{ep}=N \times d$.

The distance measurement device 300 counts the number of the light receiving time periods $t_m$ acquired, on the basis of each bin, obtains a frequency 310 in each bin, and generates the histogram. Here, the light receiving unit 302 also receives light other than the reflected light obtained by reflecting the light emitted by the light source unit 301. An example of such light other than the reflected light as a target includes the ambient light described above. In the histogram, a portion indicated by a range 311 includes an ambient light component of the ambient light. The ambient light is light incident on the light receiving unit 302 at random, and becomes noise to the reflected light as the target.

Meanwhile, the reflected light as the target is light that is received according to a specific distance, and shown as an active light component 312 in the histogram. A bin corresponding to the peak frequency in the active light component 312 is a bin corresponding to the distance D to the object 303 to be measured. Acquiring a representative time of the bin (e.g., a time at the center of the bin), as the time $t_{re}$ described above, the distance measurement device 300 is configured to calculate the distance D to the object 303 to be measured according to formula (1) described above. In this manner, use of a plurality of light reception results makes it possible to perform appropriate distance measurement against random noise.

Figure 3:
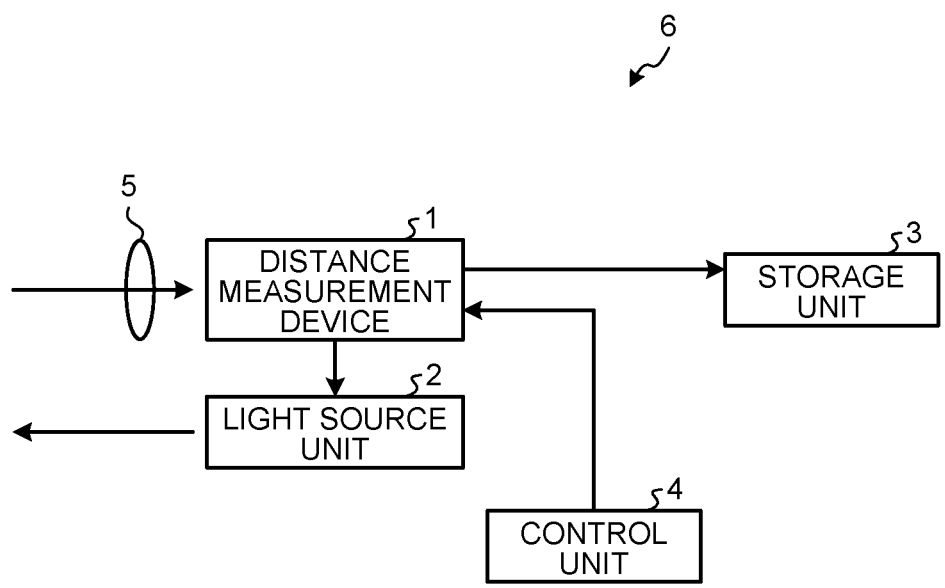
FIG. 3 is a block diagram illustrating an example of a configuration of an electronic device using a distance measurement device according to the embodiments.

FIG. 3 is a block diagram illustrating an example of a configuration of an electronic device using the distance measurement device according to the embodiments. In FIG. 3, an electronic device 6 includes a distance measurement device 1, a light source unit 2, a storage unit 3, a control unit 4, and an optical system 5.

The light source unit 2 corresponds to the light source unit 301 described above, has a laser diode, and is driven to emit, for example, pulsed laser light. To the light source unit 2, a vertical cavity surface emitting laser (VCSEL) that emits laser light as an area light source is applicable. In addition to this, a configuration using an array in which laser diodes are arranged on a line to scan laser light emitted from the laser diode array in a direction perpendicular to the line may be applied to the light source unit 2. Furthermore, a configuration using a laser diode as a single light source to scan laser light emitted from the laser diode in a horizontal and vertical directions may be applied.

The distance measurement device 1 includes a plurality of light receiving elements corresponding to the light receiving unit 302 described above. The plurality of light receiving elements is arranged, for example, into a two-dimensional lattice to form a light receiving surface. The optical system 5 guides light incident from the outside to the light receiving surface included in the distance measurement device 1.

The control unit 4 controls the overall operations of the electronic device 6. For example, the control unit 4 supplies a light emission trigger that triggers light emission of the light source unit 2, to the distance measurement device 1. The distance measurement device 1 causes the light source unit 2 to emit light at timing based on the light emission trigger, and stores the time $t_{em}$ indicating the light emission timing. Furthermore, the control unit 4 sets a pattern for distance measurement for the distance measurement device 1, for example, in response to an instruction from the outside.

The distance measurement device 1 counts the number of time information (light receiving time periods $t_m$) acquired that indicates timing at which light is received on the light receiving surface, within a predetermined time range, obtains the frequency in each bin, and generates the histogram described above. The distance measurement device 1 further calculates the distance D to the object to be measured, on the basis of the generated histogram. Information indicating the calculated distance D is stored in the storage unit 3.

Figure 4:
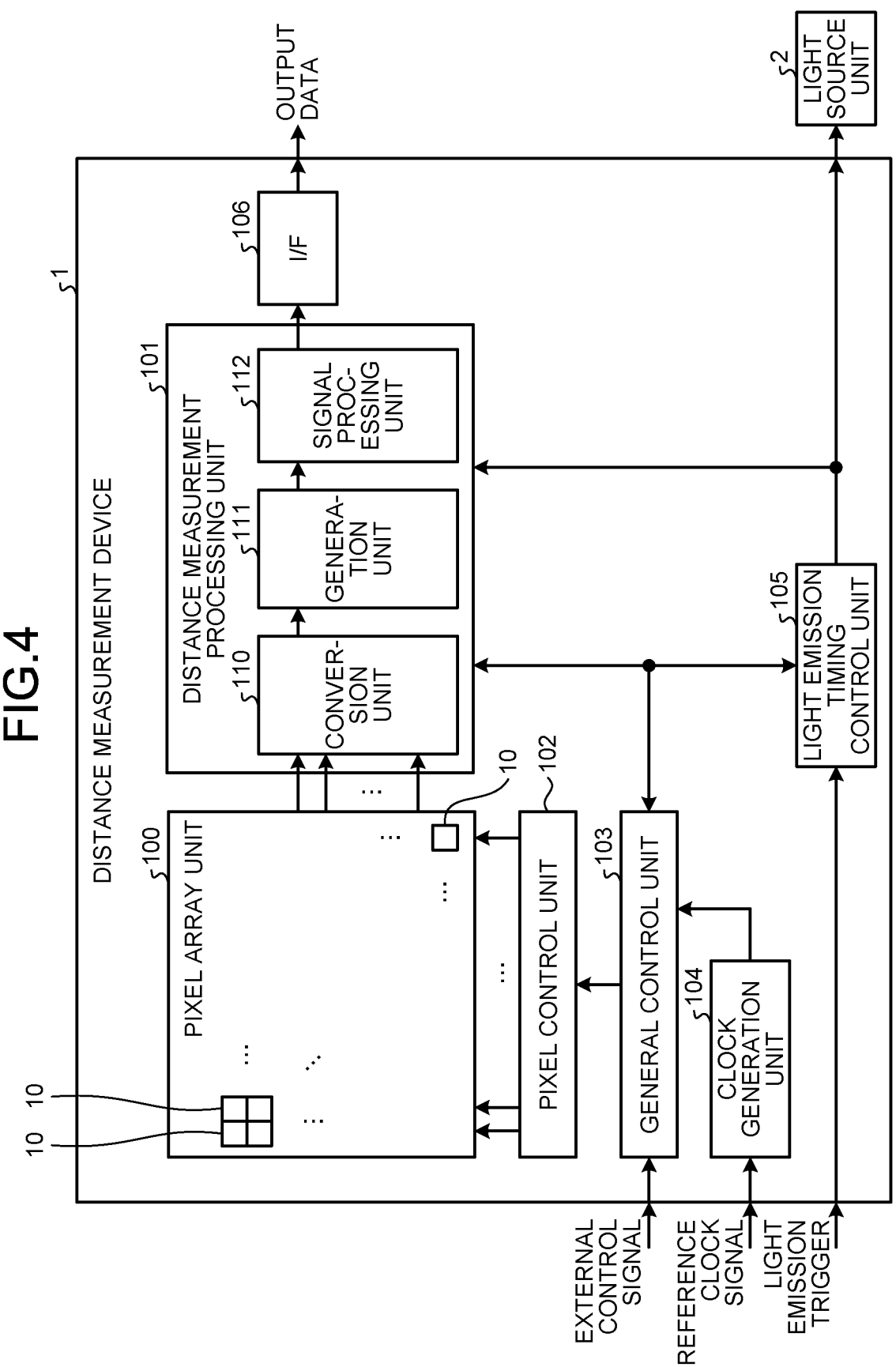
FIG. 4 is a block diagram illustrating an example of a more detailed configuration of the distance measurement device applicable to the embodiments.

FIG. 4 is a block diagram illustrating an example of a more detailed configuration of the distance measurement device 1 applicable to the embodiments. In FIG. 4, the distance measurement device 1 includes a pixel array unit 100, a distance measurement processing unit 101, a pixel control unit 102, a general control unit 103, a clock generation unit 104, a light emission timing control unit 105, and an interface (I/F) 106. The pixel array unit 100, the distance measurement processing unit 101, the pixel control unit 102, the general control unit 103, the clock generation unit 104, the light emission timing control unit 105, and the interface (I/F) 106 are configured to be arranged on one semiconductor chip.

In addition to this, the distance measurement device 1 may have a configuration in which a first semiconductor chip and a second semiconductor chip are stacked. In this configuration, for example, it is considered that part (such as the light receiving unit) of the pixel array unit 100 is arranged on the first semiconductor chip and the other part included in the distance measurement device 1 is arranged on the second semiconductor chip.

In FIG. 4, the general control unit 103 controls the overall operations of the distance measurement device 1, for example, according to a program incorporated in advance. Furthermore, the general control unit 103 is also configured to execute control according to an external control signal supplied from the outside. The clock generation unit 104 generates one or more clock signals used in the distance measurement device 1, on the basis of a reference clock signal supplied from the outside. The light emission timing control unit 105 generates a light emission control signal indicating the light emission timing according to a light emission trigger signal supplied from the outside. The light emission control signal is supplied to the light source unit 2 and also supplied to the distance measurement processing unit 101.

The pixel array unit 100 includes a plurality of pixels 10, 10, . . . arranged into a two-dimensional lattice and each including the light receiving element. The operation of each pixel 10 is controlled by the pixel control unit 102 in response to an instruction from the general control unit 103. For example, the pixel control unit 102 is configured to control reading of a pixel signal from each pixel 10, for each block including (p×q) pixels 10 of p pixels in the row direction and q pixels in the column direction. Furthermore, the pixel control unit 102 is configured to scan each pixel 10 in the row direction and further in the column direction, and read the pixel signal from each pixel 10 for each block. In addition to this, the pixel control unit 102 is configured to control the pixels 10 independently. Furthermore, the pixel control unit 102 is configured to set the pixels 10 included in the target region being a predetermined region of the pixel array unit 100, as target pixels 10 from which the pixel signal is to be read. Furthermore, the pixel control unit 102 is also configured to scan a plurality of rows (a plurality of lines) collectively, further scan the rows in the column direction, and read the pixel signals from the pixels 10.

Note that, in the following description, scanning refers to processing in which the light source unit 2 (see FIG. 4) is caused to emit light, and reading of a signal Vpls according to light received from each pixel 10 is continuously performed for the respective pixels 10 designated as a scanning target in one scan area. Light emission and reading can be performed a plurality of times in a single scan.

The pixel signal read from each pixel 10 is supplied to the distance measurement processing unit 101. The distance measurement processing unit 101 includes a conversion unit 110, a generation unit 111, and a signal processing unit 112.

The pixel signal read from each pixel 10 and output from the pixel array unit 100 is supplied to the conversion unit 110. Here, the pixel signals are asynchronously read from the pixels 10 and supplied to the conversion unit 110. In other words, the pixel signal is read and output from the light receiving element according to timing at which light is received in each pixel 10.

The conversion unit 110 converts each pixel signal supplied from the pixel array unit 100 into digital information. In other words, each pixel signal supplied from the pixel array unit 100 is output corresponding to timing at which light is received by the light receiving element included in a pixel 10 corresponding to the pixel signal. The conversion unit 110 converts the supplied pixel signal into the time information indicating the timing.

The generation unit 111 generates the histogram on the basis of the time information obtained by converting the pixel signal by the conversion unit 110. Here, the generation unit 111 counts the time information on the basis of each unit time interval d set by a setting unit 113 and generates the histogram. The histogram generation processing by the generation unit 111 will be described in detail later.

The signal processing unit 112 performs predetermined arithmetic processing on the basis of data in the histogram generated by the generation unit 111, and calculates, for example, distance information. For example, the signal processing unit 112 creates a curve approximation for the histogram on the basis of the data in the histogram generated by the generation unit 111. The signal processing unit 112 is configured to detect a peak of the curve obtained by approximation of the histogram to obtain the distance D on the basis of the detected peak.

The signal processing unit 112 is configured to perform filter processing on the curve obtained by the approximation of the histogram, when performing the curve approximation of the histogram. For example, the signal processing unit 112 is configured to perform low-pass filter processing on the curve obtained by the approximation of the histogram, suppressing a noise component.

The distance information obtained by the signal processing unit 112 is supplied to an interface 106. The interface 106 outputs, as output data, the distance information supplied from the signal processing unit 112 to the outside. For the interface 106, for example, Mobile Industry Processor Interface (MIPI) can be applied.

Note that, in the above description, the distance information obtained by the signal processing unit 112 is output to the outside via the interface 106, but the present disclosure is not limited to this example. In other words, histogram data being the data in the histogram generated by the generation unit 111 may be output to the outside from the interface 106. In this configuration, information indicating a filter coefficient can be omitted from distance measurement condition information set by the setting unit 113. The histogram data output from the interface 106 is supplied to, for example, an external information processing device and processed appropriately.

Figure 5:
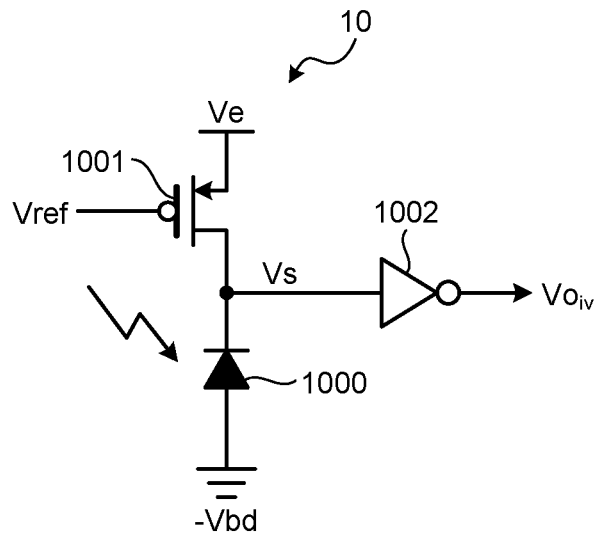
FIG. 5 is a diagram illustrating a basic configuration example of a pixel applicable to the embodiments.

FIG. 5 is a diagram illustrating a basic configuration example of the pixel 10 applicable to the embodiments. In FIG. 5, the pixel 10 includes a light receiving element 1000, a transistor 1001 that is a P-channel MOS transistor, and an inverter 1002.

The light receiving element 1000 photoelectrically converts incident light into the electric signal and outputs the electric signal. In each embodiment, the light receiving element 1000 photoelectrically converts an incident photon (photon) into the electric signal, and outputs a pulse corresponding to the incidence of the photon. In each embodiment, a single photon avalanche diode is used for the light receiving element 1000. Hereinafter, the single photon avalanche diode is referred to as SPAD. The SPAD has a characteristic that when a large negative voltage to cause an avalanche multiplication is applied to a cathode, electrons generated in response to incidence of one photon cause the avalanche multiplication, and a large current flows. Use of this characteristic of the SPAD makes it possible to detect incidence of one photon with high sensitivity.

In FIG. 5, in the light receiving element 1000 being the SPAD, the cathode is connected to a drain of the transistor 1001, and an anode is connected to a voltage source of negative voltage (−Vbd) corresponding to a breakdown voltage of the light receiving element 1000. The transistor 1001 has a source that is connected to a voltage Ve. The transistor 1001 has a gate to which a reference voltage Vref is input. The transistor 1001 is a current source configured to output a current according to the voltage Ve and the reference voltage Vref, from the drain. Such a configuration applies a reverse bias voltage to the light receiving element 1000. In addition, a photocurrent flows in a direction from the cathode toward the anode of the light receiving element 1000.

More specifically, in the light receiving element 1000, when the photon is incident while the voltage (−Vbd) is applied to the anode and charged with a potential (−Vdb), the avalanche multiplication begins, a current flows in a direction from the cathode toward the anode, and a voltage drop occurs with the current flow in the light receiving element 1000. Owing to this voltage drop, when an anode-cathode voltage of the light receiving element 1000 drops to the voltage (−Vbd), the avalanche multiplication is stopped (quenching operation). Thereafter, the light receiving element 1000 is charged with the current (recharge current) from the transistor 1001 as the current source, and the light receiving element 1000 returns to the state before photon incidence (recharging operation).

Here, the quenching operation and the recharging operation are passive operations performed without external control.

A voltage Vs extracted from a connection point between the drain of the transistor 1001 and the cathode of the light receiving element 1000 is input to the inverter 1002. The inverter 1002 performs, for example, threshold determination on the input voltage Vs, and inverts an output signal $Vo_{iv}$ every time the voltage Vs exceeds a threshold voltage Vth in a positive direction or negative direction.

More specifically, the inverter 1002 inverts the output signal $Vo_{iv}$ at the first timing when the voltage Vs crosses the threshold voltage Vth, in the voltage drop due to the avalanche multiplication in response to the incidence of the photon on the light receiving element 1000. Next, the light receiving element 1000 is charged by the recharging operation, and the voltage Vs increases. The inverter 1002 inverts the output signal $Vo_{iv}$ again at the second timing when the increasing voltage Vs crosses the threshold voltage Vth. A width in a time direction between the first timing and the second timing is an output pulse in response to the incidence of the photon on the light receiving element 1000.

This output pulse corresponds to each of the pixel signals asynchronously output from the pixel array unit 100 described with reference to FIG. 4. In FIG. 4, the conversion unit 110 converts the output pulse into time information indicating the timing of supply of the output pulse and transmits the time information to the generation unit 111. The generation unit 111 generates the histogram on the basis of the time information.

Figure 6:
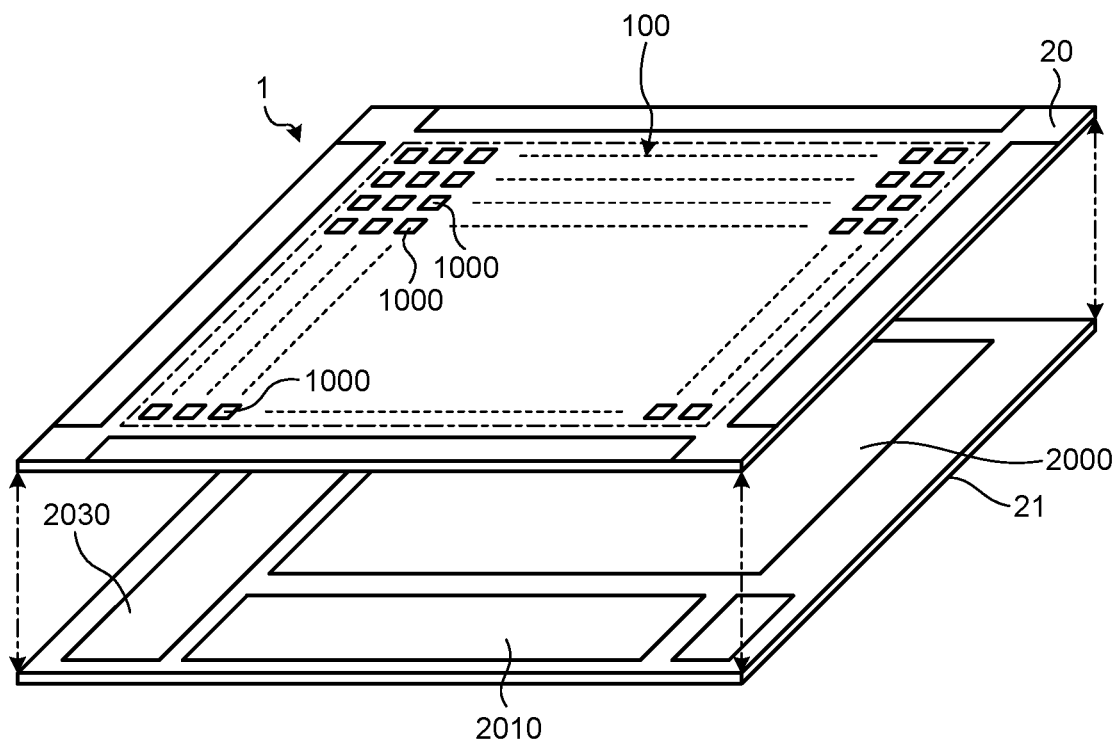
FIG. 6 is a schematic diagram illustrating an example of a configuration of a device applicable to the distance measurement device according to the embodiments.

FIG. 6 is a schematic diagram illustrating an example of a configuration of a device applicable to the distance measurement device 1 according to the embodiments. In FIG. 6, the distance measurement device 1 is configured by stacking a light receiving chip 20 and a logic chip 21 each including a semiconductor chip. Note that in FIG. 5, for the sake of description, the light receiving chip 20 and the logic chip 21 are separated.

In the light receiving chip 20, the light receiving elements 1000 included in the plurality of pixels 10 are arranged into a two-dimensional lattice in the region of the pixel array unit 100. Furthermore, in each of the pixels 10, the transistor 1001 and the inverter 1002 are formed on the logic chip 21. Both ends of the light receiving element 1000 are connected between the light receiving chip 20 and the logic chip 21 via a coupling portion 1105 using copper-copper connection (CCC).

The logic chip 21 is provided with a logic array unit 2000 that includes a signal processing unit configured to process a signal acquired by the light receiving element 1000. The logic chip 21 can be provided with a signal processing circuit unit 2010 configured to process the signal acquired by the light receiving element 1000, and a device control unit 2030 configured to control an operation as the distance measurement device 1, in the vicinity of the logic array unit 2000.

For example, the signal processing circuit unit 2010 can include the distance measurement processing unit 101 described above. Furthermore, the device control unit 2030 can include the pixel control unit 102, the general control unit 103, the clock generation unit 104, the light emission timing control unit 105, and the interface 106 which are described above.

Note that the configurations on the light receiving chip 20 and logic chip 21 are not limited to this example. Furthermore, the device control unit 2030 is configured to be arranged, for example, in the vicinity of the light receiving elements 1000 for the purpose of drive or control of other component elements, in addition to the control of the logic array unit 2000. In addition to the arrangement illustrated in FIG. 6, the device control unit 2030 is configured to be provided in any region of the light receiving chip 20 and logic chip 21 so as to have any function.

(Control of Light Receiving Element According to Existing Technology)

Figure 7:
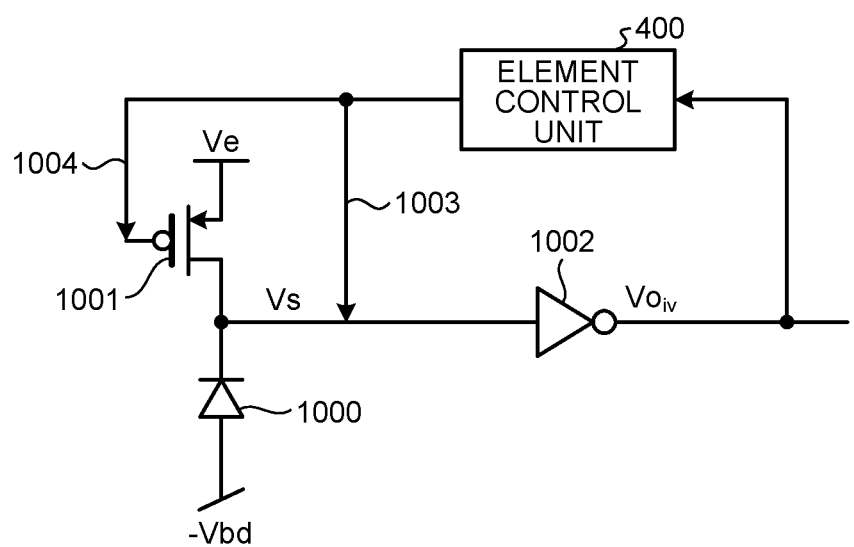
FIG. 7 is a diagram schematically illustrating an example of a configuration for controlling a light receiving element by using an active quenching/recharging according to an existing technology.

Next, prior to the description of the present disclosure, control of the light receiving element 1000 according to an existing technology will be described. FIG. 7 is a diagram schematically illustrating an example of a configuration for controlling the light receiving element 1000 by using active quenching/recharging according to the existing technology.

In FIG. 7, an element control unit 400 includes delay means. When the photon is incident on the light receiving element 1000 and a current flows due to the avalanche multiplication, the element control unit 400 provides a first delay by using the delay means to timing at which the output signal $Vo_{iv}$ of the inverter 1002 is inverted first to control quenching means 1003, performing the quenching operation. After performing the quenching operation, the element control unit 400 further provides a second delay by using the delay means to control recharging means 1004, performing the recharging operation.

Here, as described with reference to FIG. 5, an interval (inversion timing interval) between the first timing relating to the quenching operation and the second timing relating to the recharging operation of the output signal $Vo_{iv}$ of the inverter 1002 with respect to the voltage Vs is the width of the output pulse indicating the incidence of the photon on the light receiving element 1000. A charging speed at which the light receiving element 1000 is charged by the recharging operation can be increased by increasing the amount of current supplied by the transistor 1001 as the current source. Meanwhile, increasing the speed of charging by the recharging operation more than necessary may prevent the current flowing through the light receiving element 1000 in response to the incidence of the photon from stopping even if the quenching operation is performed.

Therefore, in the active quenching/recharging, it is necessary to appropriately control the first timing and the second timing by the delay means in the element control unit 400.

Figure 8A:
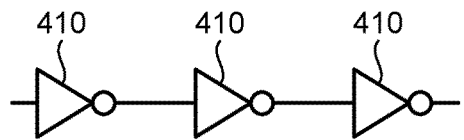
FIG. 8A is a diagram illustrating an example of delay means included in an element control unit according to an existing technology.
Figure 8B:
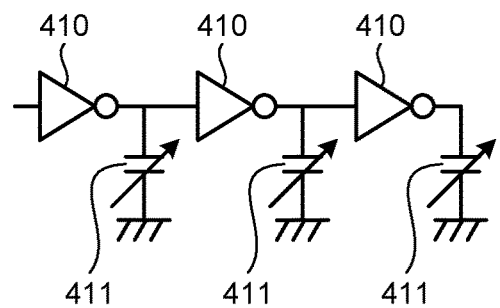
FIG. 8B is a diagram illustrating an example of the delay means included in the element control unit according to the existing technology.
Figure 8C:
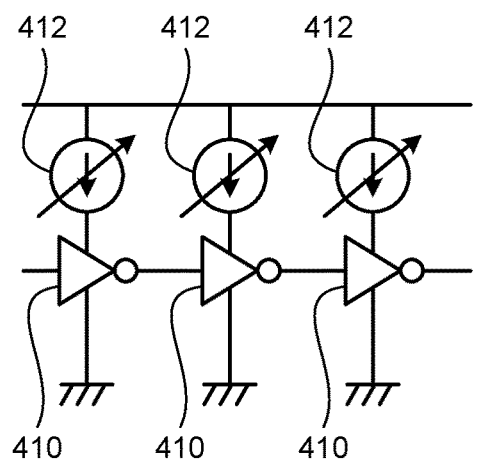
FIG. 8C is a diagram illustrating an example of the delay means included in the element control unit according to the existing technology.
Figure 8D:
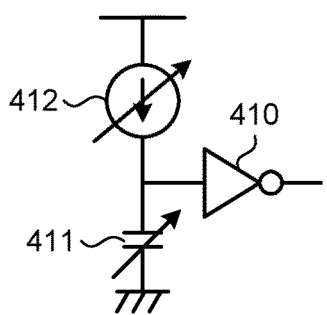
FIG. 8D is a diagram illustrating an example of the delay means included in the element control unit according to the existing technology.

FIGS. 8A, 8B, 8C, and 8D are diagrams illustrating examples of the delay means included in the element control unit 400 according to the existing technology. FIG. 8A illustrates an example of the delay means constituted by an inverter chain having a plurality of inverters 410 connected in series. FIG. 8B illustrates an example of the delay means in which adjustment of a load capacity 411 of each inverter 410 enables setting of the delay amount in output of each inverter 410, in the inverter chain illustrated in FIG. 8A. FIG. 8C is an example of the delay means in which adjustment of a current source 412 configured to supply the current to each inverter 410 enables setting of the delay amount in output of each inverter 410, in the inverter chain illustrated in FIG. 8A. FIG. 8D illustrates an example of the delay means in which adjustment of the current source 412 and the capacity 411 that are provided on the input side of the inverter 410 sets the delay amount of a signal output from the inverter 410.

The above delay means illustrated in FIGS. 8A, 8B, 8C, and 8D each generate a delay by analog signal processing. Therefore, it is difficult to avoid variations in a delay time to be generated, due to variations in characteristics or the like of the elements. In addition, the configurations in which the delay amount is adjustable, illustrated in FIGS. 8B, 8C, and 8D, include analog elements such as the capacities 411 and the current sources 412. Therefore, the delay means is susceptible to process/voltage/temperature (PVT) variation, external noise, or the like.

For example, when the output pulses output from the pixels 10 have variations in width due to variations in delay time, a subsequent circuit (the conversion unit 110, generation unit 111, or the like) needs to be designed according to the maximum width in the output pulses. Therefore, it is difficult to improve the dynamic range (saturated count rate).

First Embodiment

Next, a first embodiment of the present disclosure will be described. In the first embodiment, the quenching operation and the recharging operation are controlled on the basis of a clock having a predetermined period, in the active quenching/recharging.

Figure 9:
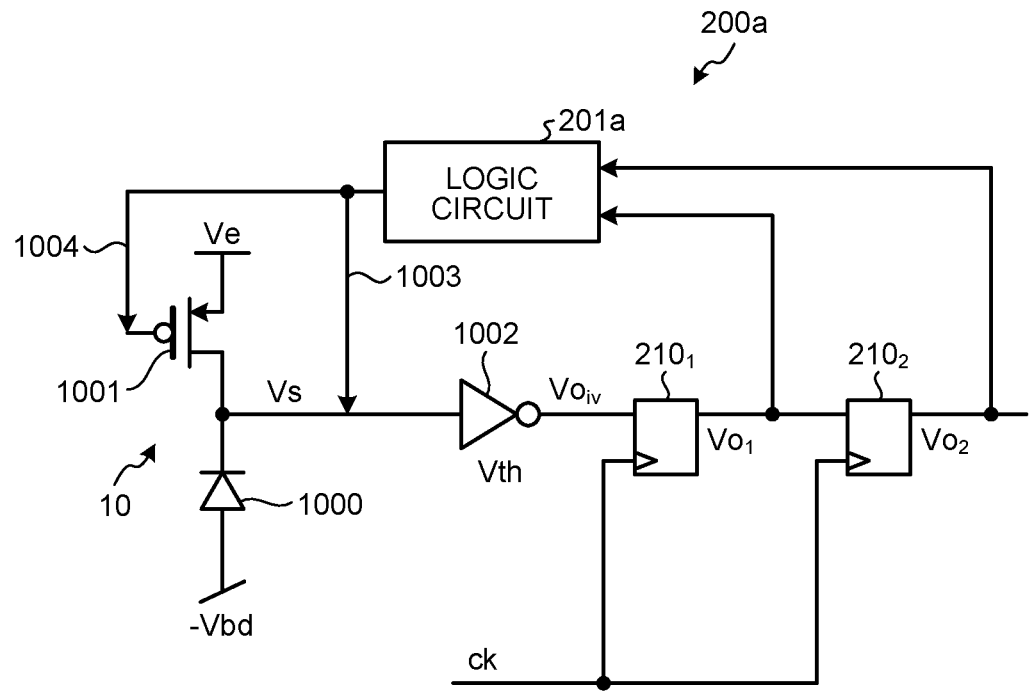
FIG. 9 is a diagram schematically illustrating an example of a configuration for controlling a light receiving element by using active quenching/recharging according to a first embodiment.

FIG. 9 is a diagram schematically illustrating an example of a configuration for controlling a light receiving element 1000 by using the active quenching/recharging according to the first embodiment. In the example of FIG. 9, an element control unit 200a configured to control the quenching operation and the recharging operation of the light receiving element 1000 includes a logic circuit 201a, delay circuits $210_1$ and $210_2$, the quenching means 1003, and the recharging means 1004. In the example of FIG. 9, each of the delay circuits $210_1$ and $210_2$ uses a D-flip-flop (FF) circuit that latches an input signal according to a clock signal ck providing a clock having a predetermined period.

In the element control unit 200a, the delay circuits $210_1$ and $210_2$ have clock input terminals to which the clock signal ck is input in common. The delay circuit $210_1$ has a delay input terminal to which the output signal $Vo_{iv}$ output from the inverter 1002 is input. The delay circuit $210_1$ delays the output signal $Vo_{iv}$ input to the delay input terminal and outputs the delayed output signal $Vo_{iv}$ as an output signal $Vo_1$. The output signal $Vo_1$ output from the delay circuit $210_1$ is input to a delay input terminal of the delay circuit $210_2$. The delay circuit $210_2$ further delays the output signal $Vo_1$ input to the delay input terminal and outputs the delayed output signal $Vo_1$ as an output signal $Vo_1$.

Furthermore, the output signal $Vo_1$ output from the delay circuit $210_1$ and the output signal $Vo_1$ output from the delay circuit $210_2$ are input to the logic circuit 201a.

The logic circuit 201a controls the quenching means 1003 and the recharging means 1004 on the basis of the output signal $Vo_1$ supplied from the delay circuit $210_1$ and the output signal $Vo_1$ supplied from the delay circuit $210_2$. As described above, the element control unit 200 according to the first embodiment controls the quenching operation by the quenching means 1003 and the recharging operation by the recharging means 1004, on the basis of the synchronized clock signal ck.

Therefore, according to the first embodiment, the delay amount to each of the quenching operation and the recharging operation is determined on the basis of the clock signal ck, and thus, the variations in the delay amount between the pixels 10 can be suppressed. In addition, the delay amount is determined on the basis of the clock signal ck, and thus, influence of the PVT variation, external noise, or the like in each element on the delay amount can be suppressed. Therefore, application of the first embodiment makes it possible to stably control the operation of the light receiving element 1000.

Figure 10:
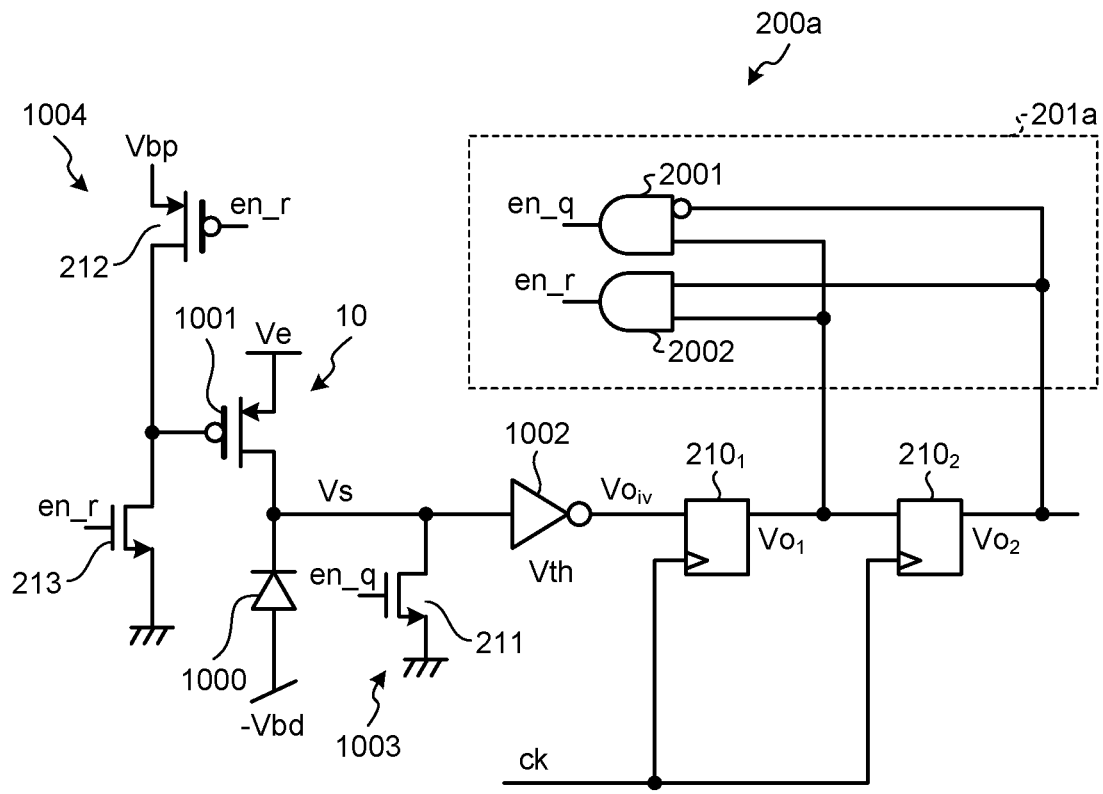
FIG. 10 is a diagram illustrating a more detailed example of the configuration according to the first embodiment.

FIG. 10 is a diagram illustrating a more detailed example of the configuration according to the first embodiment. In FIG. 10, the logic circuit 201a includes AND circuits 2001 and 2002. The AND circuit 2001 has one input terminal that is an inverting input terminal configured to invert an input signal. The output signal $Vo_1$ output from the delay circuit $210_2$ is input to one input terminal (the inverting input terminal) of the AND circuit 2001 and one input terminal of the AND circuit 2002. Furthermore, the output signal $Vo_1$ output from the delay circuit $210_1$ is input to the other input terminal (the non-inverting input terminal) of the AND circuit 2001 and the other input terminal of the AND circuit 2002.

The AND circuit 2001 outputs an AND of the output signal $Vo_1$ inverted and input to one input terminal and the output signal $Vo_1$ input to the other input terminal, as a control signal en_q controlling the operation of the quenching means 1003. Furthermore, the AND circuit 2002 outputs an AND of the output signals $Vo_1$ and $Vo_1$ input to one and the other input terminals, as a control signal en_r controlling the recharging means 1004.

In the example of FIG. 10, the quenching means 1003 includes a transistor 211 that is an N-channel metal oxide semiconductor (MOS) transistor. The transistor 211 has a drain that is connected to a connection point where the cathode of the light receiving element 1000 and the drain of the transistor 1001 are connected. The transistor 211 has a source that is connected to the ground voltage. The transistor 211 has a gate to which the control signal en_q is input.

Furthermore, in the example of FIG. 10, the recharging means 1004 includes a transistor 212 that is a P-channel MOS transistor and a transistor 213 that is an N-channel MOS transistor. The transistor 212 has a source to which a predetermined bias voltage Vbp is supplied. A drain of the transistor 212 is connected to a drain of the transistor 213, and the gate of the transistor 1001 is connected to a connection point where the drain of the transistor 212 is connected to the drain of the transistor 213. The transistor 213 has a source that is connected to the ground voltage. The transistors 212 and 213 have gates to which the control signal en_r is input.

Figure 11:
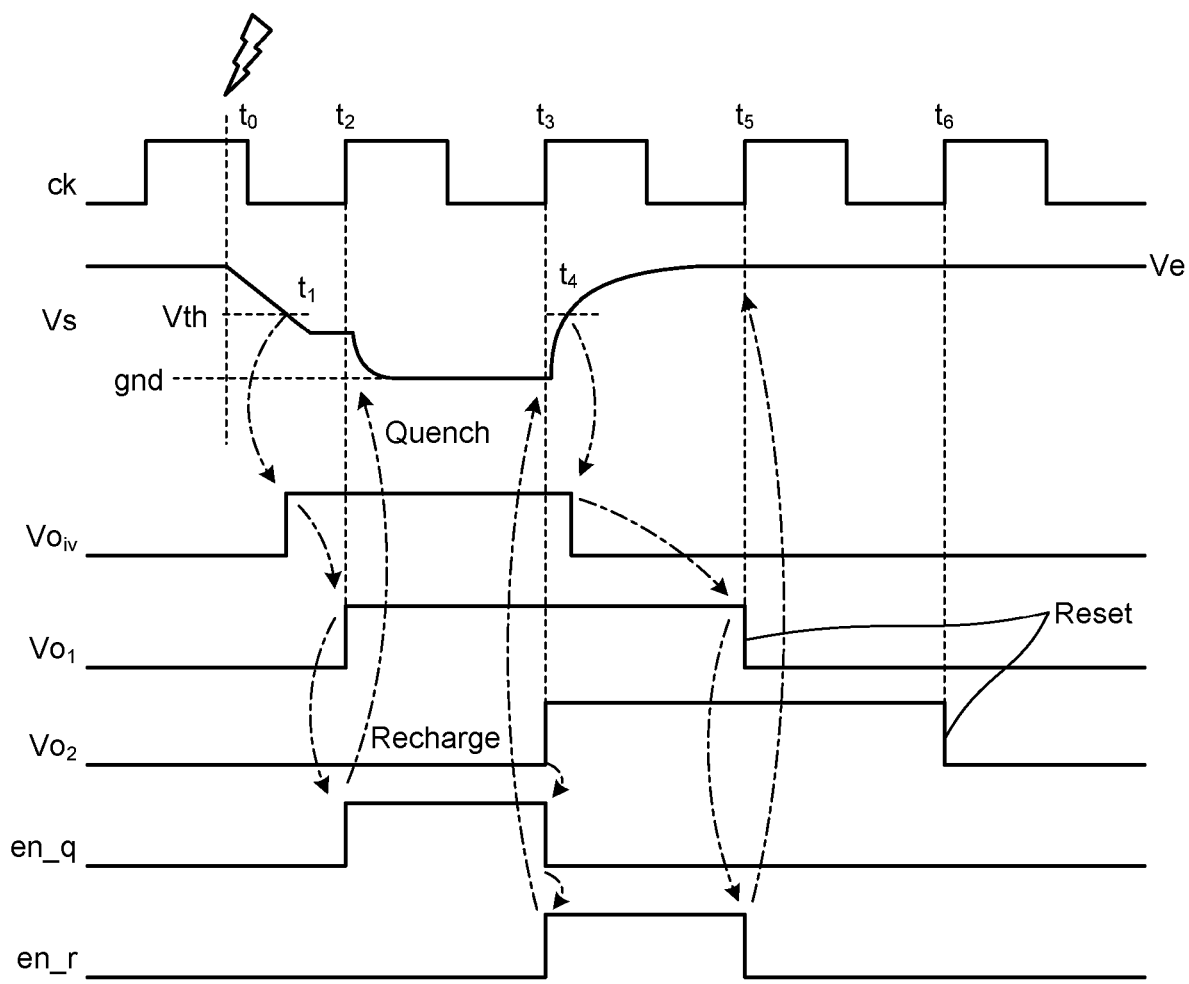
FIG. 11 is a timing chart illustrating an example of an operation according to the first embodiment.

FIG. 11 is a timing chart illustrating an example of operations performed by the configuration of FIG. 10, according to the first embodiment. In FIG. 11, the horizontal axis represents time, and in the vertical direction, the clock signal ck, the voltage Vs, the output signals $Vo_{iv}$, $Vo_1$, and $Vo_1$, and the control signals en_q and en_r are represented.

As illustrated in FIG. 11, in an initial state before a photon is incident on the light receiving element 1000 at a time $t_0$, the voltage Vs being in a high state is inverted by the inverter 1002, the output signal $Vo_{iv}$ of the inverter 1002 is in a low state, and the output signals $Vo_1$ and $Vo_2$ of the delay circuits $210_1$ and $210_2$ are each in a low state. The output signal $Vo_1$ input to the other input terminal is in the low state, and thus, the control signal en_q is in a low state. In addition, the output signals $Vo_1$ and $Vo_2$ are each in the low state, and thus, the control signal en_r is in a low state.

In FIG. 11, when the photon is incident on the light receiving element 1000 at the time $t_0$, a current flows through the light receiving element 1000 due to the avalanche multiplication, and the voltage Vs drops with the current flow. When the voltage Vs crosses the threshold voltage Vth in the inverter 1002 at a time $t_1$, the inverter 1002 inverts the output signal $Vo_{iv}$ into a high state. The high state of the output signal $Vo_{iv}$ is latched in the delay circuit $210_1$ at the next rising timing (time $t_2$) of the clock signal ck, and the output signal $Vo_1$ of the delay circuit $210_1$ is brought into a high state. In other words, the delay circuit $210_1$ delays the output signal $Vo_{iv}$ output from the inverter 1002 according to the clock signal ck.

The output signal $Vo_1$ of the delay circuit $210_1$ is latched in the delay circuit $210_2$ at the next rising timing (time $t_3$) of the clock signal ck, and the output signal $Vo_2$ of the delay circuit $210_2$ is brought into a high state. In other words, the delay circuit $210_2$ further delays the output signal $Vo_{iv}$ of the inverter 1002 having been delayed according to the clock signal ck in the delay circuit $210_1$, according to the clock signal ck.

Here, in a period from the time $t_2$ to the time $t_3$, the output signal $Vo_1$ of the delay circuit $210_1$ is in the high state, and the output signal $Vo_2$ of the delay circuit $210_2$ is in the low state. Therefore, the control signal en_r output from the AND circuit 2002 is maintained in the low state, while the control signal en_q output from the AND circuit 2001 is brought into a high state. Therefore, the transistor 211 is on, the cathode of the light receiving element 1000 is connected to the ground voltage (gnd), and the quenching operation (Quench) is performed.

When the output signal $Vo_2$ of the delay circuit $210_2$ is brought into the high state at the time $t_3$, the output signals $Vo_1$ and $Vo_2$ are each brought into the high state. Therefore, the control signal en_q output from the AND circuit 2001 is brought into the low state, and the transistor 211 is brought into an off state in the quenching means 1003. Meanwhile, at the time $t_3$, the control signal en_r output from the AND circuit 2002 is brought into a high state, and in the recharging means 1004, the transistor 212 is brought into an off state and the transistor 213 is brought into an on state. Thus, the gate of the transistor 1001 is brought into a low state, the transistor 1001 is brought into an on state, and at the time $t_3$, the recharging operation (Recharge) is performed to charge the light receiving element 1000 with the voltage Ve.

When charge of the light receiving element 1000 is started by the recharging operation, the voltage Vs increases according to the charge amount. When the voltage Vs crosses the threshold voltage Vth (time $t_4$), the inverter 1002 inverts the output signal $Vo_{iv}$ into the low state. In the example of FIG. 11, the time $t_4$ at which the output signal $Vo_{iv}$ is inverted is the timing after the time $t_3$ at which the recharging operation is started.

At the next rising timing (time $t_5$) of the clock signal ck, the output signal $Vo_1$ of the delay circuit $210_1$ is brought into the low state. Meanwhile, the output signal $Vo_2$ of the delay circuit $210_2$ is in the high state at the time $t_5$, and thus, the control signal en_r output from the AND circuit 2002 is brought into the low state. In other words, at the time $t_5$, the control signals en_q and en_r are brought into the low state, and the transistors 211, 212, and 213 are brought into the initial state (Reset).

At the next rising timing (time $t_6$) of the clock signal ck, the output signal $Vo_2$ of the delay circuit $210_2$ is brought into the low state.

Note that, in the above description, at the time $t_5$ at which the output signal $Vo_1$ of the delay circuit $210_1$ is brought into the low state, each of the transistors 211, 212, and 213 is in, but is not limited to, the initial state. In other words, the timing to bring each of the transistors 211, 212, and 213 into the initial state may differ depending on a settling time for the voltage Vs. In an example, it is considered to perform initialization of the transistors 211, 212, and 213 at the time $t_6$, in a case where the recharging operation is completed during a period from the time $t_5$ to the time $t_6$ at which the next clock signal ck rises. In this case, the logic circuit 201a is changed to have a corresponding configuration.

Figure 12:
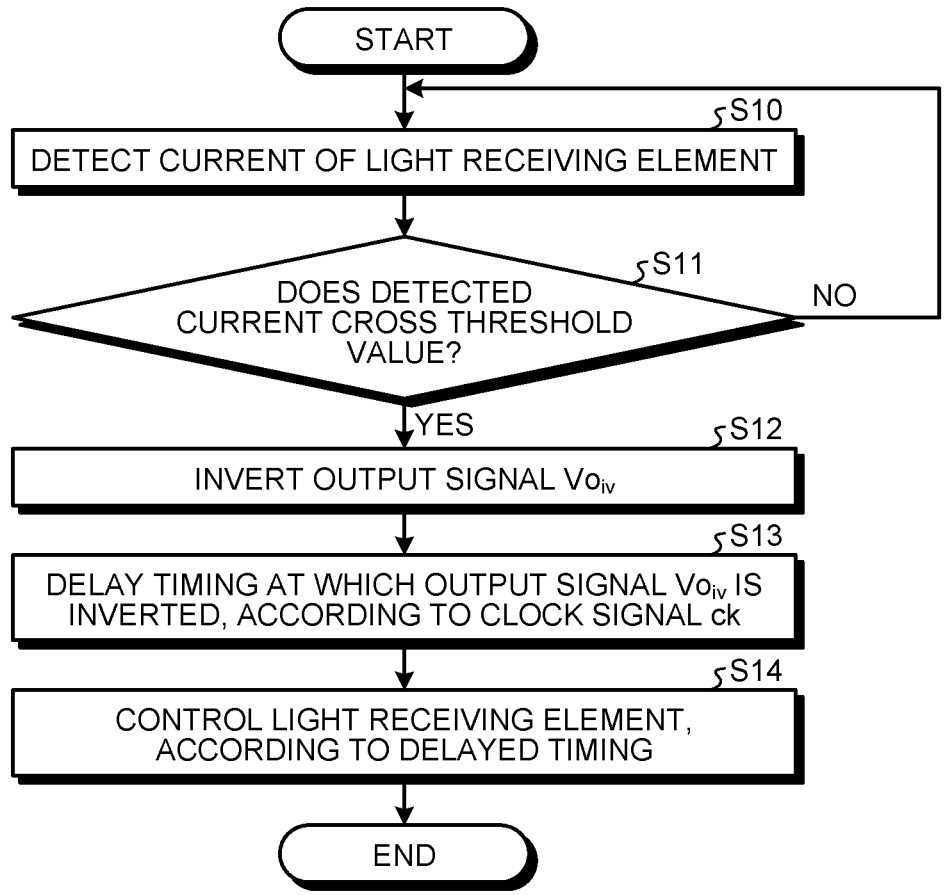
FIG. 12 is a flowchart illustrating an example of controlling the light receiving element according to the first embodiment.

FIG. 12 is a flowchart illustrating an example of controlling the light receiving element according to the first embodiment. Prior to performance of the process according to the flowchart of FIG. 12, each unit of the element control unit 200a is in the initial state illustrated in FIG. 11.

In Step S10, the inverter 1002 detects a current flowing through the light receiving element 1000. In the next Step S11, the inverter 1002 determines whether the current detected in Step S10 crosses a threshold value. When determining that the detected current does not cross the threshold value (Step S11, "No"), the inverter 1002 returns to Step S10 and continues the detection of the current. Meanwhile, when determining that the current detected in Step S10 crosses the threshold value (Step S11, "Yes", time $t_1$ in FIG. 11), the inverter 1002 proceeds to Step S12.

Note that, in Step S10, actually, the inverter 1002 detects the voltage Vs in the light receiving element 1000 generated due to the current flowing through the light receiving element 1000. In Step S11, the inverter 1002 determines whether the voltage Vs crosses the threshold voltage Vth.

In Step S12, the inverter 1002 inverts the output signal $Vo_{iv}$. In the next Step S13, the logic circuit 201a delays the timing at which the output signal $Vo_{iv}$ is inverted by the inverter 1002 in Step S12, according to the clock signal ck (time $t_2$ in FIG. 11).

In the next Step S14, the logic circuit 201a controls the light receiving element 1000 according to the timing delayed in Step S13. More specifically, in Step S14, the logic circuit 201a controls the quenching means 1003 and the recharging means 1004 according to the timing and causes the light receiving element 1000 to perform the quenching operation and the recharging operation. In practice, as described above, the logic circuit 201a starts the recharging operation of the light receiving element 1000, at the next rising timing (time $t_3$ in FIG. 11) of the clock signal ck after controlling the quenching means 1003 (time $t_2$ in FIG. 11).

After completion of the recharging operation, each unit of the element control unit 200a is brought into the initial state according to the clock signal ck (time points $t_5$ and $t_6$ in FIG. 11).

First Modification of First Embodiment

Next, a first modification of the first embodiment will be described below. In the first embodiment described above, the output signal $Vo_{iv}$ output from the inverter 1002 is delayed using the two delay circuits $210_1$ and $210_2$. The delaying of the output signal $Vo_{iv}$ is not limited to this example, and three or more delay circuits that synchronize with the clock signal ck may be used to delay the output signal $Vo_{iv}$ output from the inverter 1002.

Figure 13:
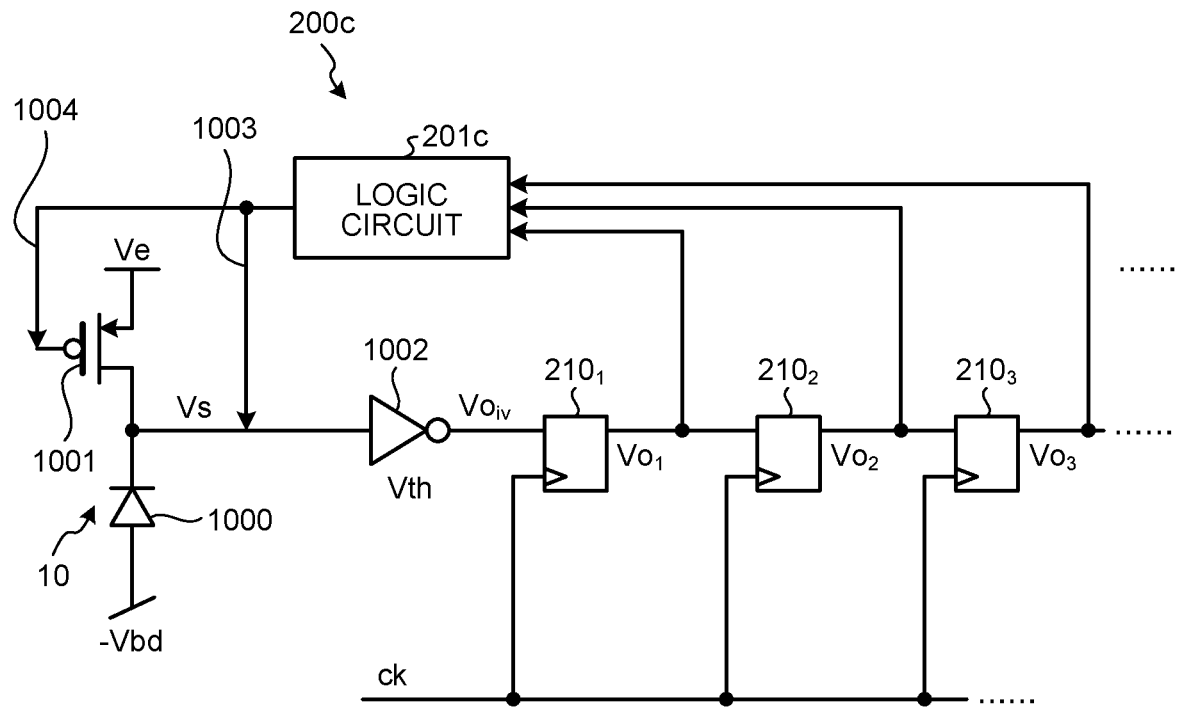
FIG. 13 is a diagram illustrating an example of a configuration of an element control unit according to a first modification of the first embodiment.
Figure 14:
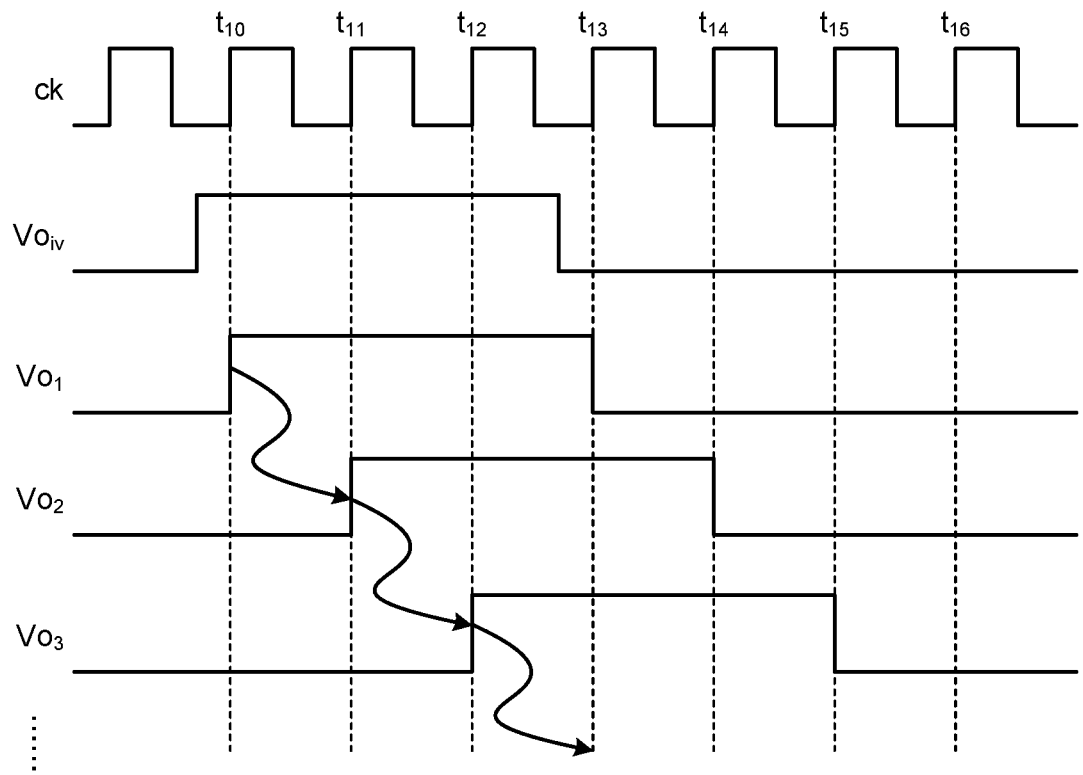
FIG. 14 is a timing chart illustrating an example of timing of an output signal from each delay circuit in the element control unit according to the first modification of the first embodiment.

FIG. 13 is a diagram illustrating an example of a configuration of an element control unit according to the first modification of the first embodiment. In the example of FIG. 13, three or more delay circuits $210_1$, $210_2$, $210_3$, . . . are illustrated in which an element control unit 200c according to the first modification of the first embodiment operates in synchronization with the same clock signal ck. FIG. 14 is a timing chart illustrating an example of timing of each of output signals $Vo_1$, $Vo_2$, and $Vo_3$, . . . of the delay circuits $210_1$, $210_2$, and $210_3$, . . . in the element control unit 200c according to the first modification of the first embodiment illustrated in FIG. 13.

In the configuration of FIG. 13, the delay circuit $210_1$ latches the transition of the output signal $Vo_{iv}$ output from the inverter 1002 to the high state, at the rising timing of the clock signal ck at a time $t_{10}$, and brings the output signal $Vo_1$ into the high state. The delay circuit $210_2$ latches the transition of the output signal $Vo_1$ to the high state at the next rising timing (time $t_{11}$) of the clock signal ck and brings the output signal $Vo_2$ into the high state. The delay circuit $210_3$ latches the transition of the output signal $Vo_2$ to the high state at the next rising timing (time $t_{12}$) of the clock signal ck, and brings the output signal $Vo_3$ into the high state.

Thereafter, when the delay circuits are further connected in series, each of the delay circuits sequentially latches the transition of the output signal of the previous delay circuit to the high state, at the rising timing of the clock signal ck, and transitions its own output voltage to the high state. As described above, in a case where a plurality of delay circuits that each use the D-FF circuit and operates in synchronization with the common clock signal ck is connected in series, the output signal of each delay circuit is taken over to the subsequent delay circuit, according to the period of the clock signal ck.

Figure 15:
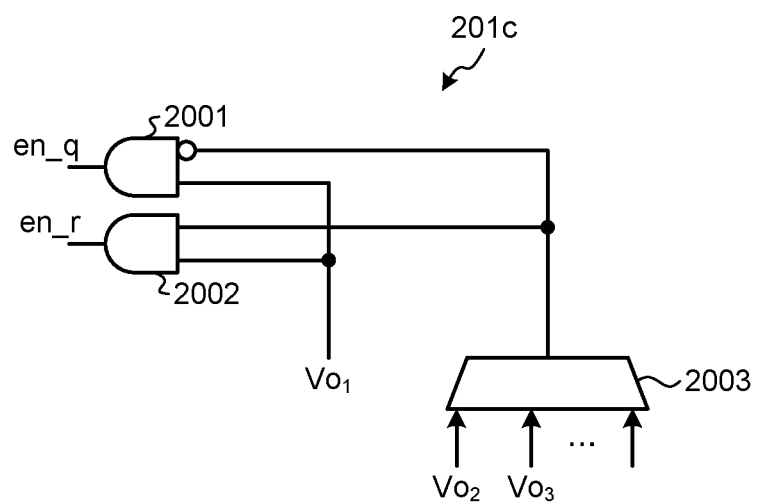
FIG. 15 is a diagram illustrating an example of a configuration of a logic circuit according to the first modification of the first embodiment.

FIG. 15 is a diagram illustrating an example of a configuration of a logic circuit 201c according to the first modification of the first embodiment. As in the logic circuit 201a described with reference to FIG. 10, the logic circuit 201c includes the AND circuit 2001 that has one input terminal being the inverting input terminal and the other input terminal being the non-inverting input terminal, and the AND circuit 2002 that has one and the other input terminals both being the non-inverting input terminal. The logic circuit 201c further includes a selector 2003.

In the example of FIG. 15, the output signal $Vo_1$ of the delay circuit $210_1$ is input to the other input terminals of the AND circuits 2001 and 2002, as in the example of FIG. 10. An output of the selector 2003 is input to one input terminal of each of the AND circuits 2001 and 2002. The selector 2003 has selection input terminals to which the output signals $Vo_2$, $Vo_3$, ... of the delay circuits $210_2$, $210_3$, ... are input. The selector 2003 selects one of the output signals $Vo_2$, $Vo_3$, ... input to the selection input terminals and inputs the selected output signal to one input terminal of each of the AND circuits 2001 and 2002.

The AND circuits 2001 and 2002 output the control signals en_q and en_r, on the basis of output voltage, selected from the output signals $Vo_2$, $Vo_3$, ... by the selector 2003 and input to one input terminal of each of the AND circuits 2001 and 2002, and the output signal $Vo_1$, output from the delay circuit $210_1$. The quenching means 1003 and the recharging means 1004 are controlled according to the control signals en_q and en_r, as described with reference to FIGS. 10 and 11. Note that the configuration described with reference to FIG. 10 is applicable to the configurations of the quenching means 1003 and the recharging means 1004 without change.

As described above, the serial connection of three or more delay means makes it possible to adjust the delay time of the recharging operation with respect to the quenching operation in periods of the clock signal ck.

Second Modification of First Embodiment

Next, a second modification of the first embodiment will be described. In the first embodiment described above, the operations of the delay circuits $210_1$ and $210_2$ are synchronized with the rising timing of the clock signal ck. Meanwhile, in the second modification of the first embodiment, the delay circuits $210_1$ and $210_2$ are operated by further using the falling timing of the clock signal ck.

Figure 16:
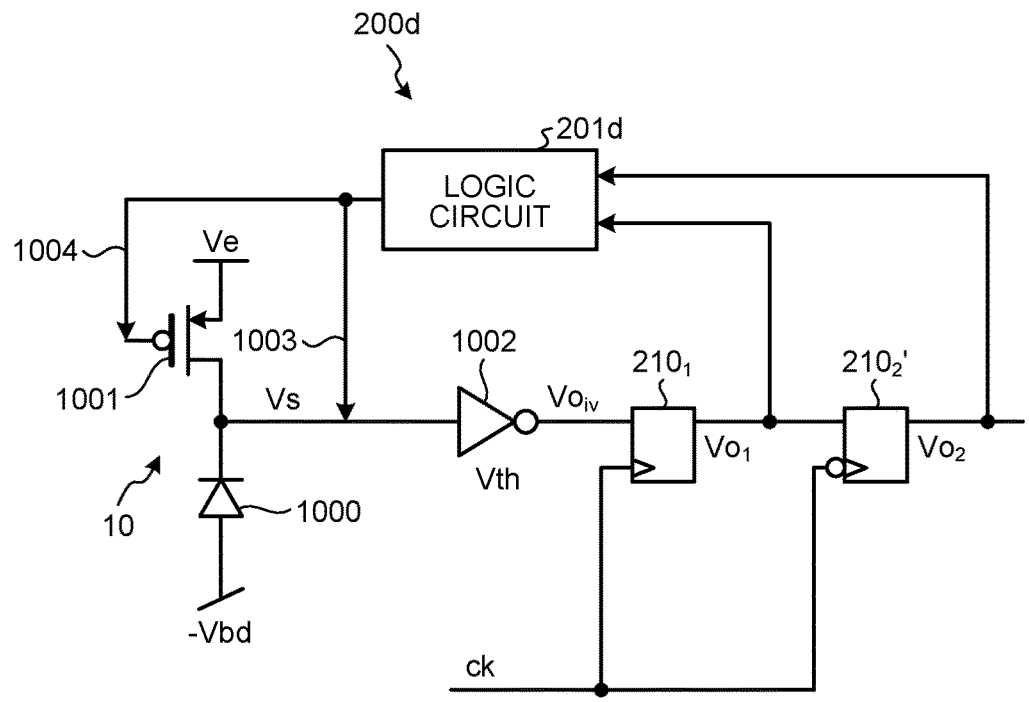
FIG. 16 is a diagram illustrating an example of a configuration of an element control unit according to a second modification of the first embodiment.

FIG. 16 is a diagram illustrating an example of a configuration of an element control unit according to the second modification of the first embodiment. The element control unit 200d illustrated in FIG. 16 is an example in which a delay circuit $210_2$' that has the clock input terminal being the inverting input terminal is used in place of the delay circuit $210_2$ included in the element control unit 200a described with reference to FIGS. 9 and 10. The delay circuit $210_2$' operates in synchronization with the falling timing of the clock signal ck. In addition, a logic circuit 201d has the same configuration as the logic circuit 201a described with reference to FIG. 10.

Note that to portions other than the delay circuit $210_2$' illustrated in FIG. 16, the same configuration as that in FIGS. 9 and 10 is applicable, and thus, detailed description thereof is omitted here.

Figure 17:
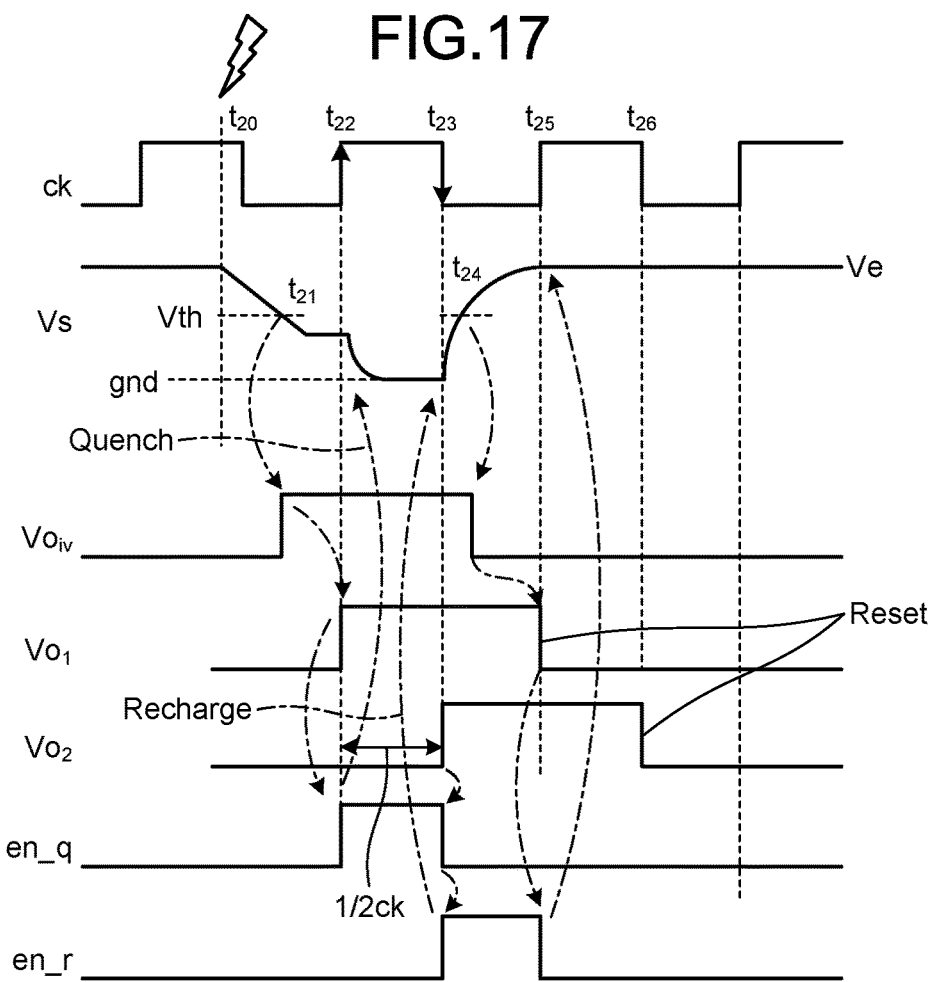
FIG. 17 is a timing chart illustrating an example of an operation according to the second modification of the first embodiment.

FIG. 17 is a timing chart illustrating an example of an operation according to the second modification of the first embodiment. As in the above description of FIG. 11, in FIG. 17, the horizontal axis represents time, and in the vertical direction, the clock signal ck, the voltage Vs, the output signals $Vo_{iv}$, $Vo_1$, and $Vo_2$, and the control signals en_q and en_r are represented. In an initial state before the photon is incident on the light receiving element 1000 at a time $t_{20}$, the voltage Vs is in the high state, the output signal $Vo_{iv}$ of the inverter 1002 is in the low state, and the output signals $Vo_1$ and $Vo_2$ of the delay circuits $210_1$ and $210_2$ are in the low state. Furthermore, in the initial state, each of the control signals en_q and en_r are each in the low state.

In FIG. 17, when the photon is incident on the light receiving element 1000 at the time $t_{20}$, a current flows through the light receiving element 1000 due to the avalanche multiplication, and the voltage Vs drops with the current flow. When the voltage Vs crosses the threshold voltage Vth in the inverter 1002 at a time $t_{21}$, the inverter 1002 inverts the output signal $Vo_{iv}$ into the high state. The high state of the output signal $Vo_{iv}$ is latched in the delay circuit $210_1$ at the next rising timing (time $t_{22}$) of the clock signal ck, and the output signal $Vo_1$ of the delay circuit $210_1$ is brought into the high state. In other words, the delay circuit $210_1$ delays the output signal $Vo_{iv}$ output from the inverter 1002 according to the clock signal ck.

The output signal $Vo_1$ of the delay circuit $210_1$ is latched in the delay circuit $210_2$ at the next falling timing (time $t_{23}$) of the clock signal ck, and the output signal $Vo_2$ of the delay circuit $210_2$ is brought into the high state. In other words, the delay circuit $210_2$ further delays the output signal $Vo_{iv}$ of the inverter 1002 having been delayed according to the clock signal ck in the delay circuit $210_1$, according to the clock signal ck.

In a period from the time $t_{22}$ to the time $t_{23}$, the output signal $Vo_1$ of the delay circuit $210_1$ is in the high state, and the output signal $Vo_2$ of the delay circuit $210_2$ is in the low state. Therefore, the control signal en_r output from the AND circuit 2002 is maintained in the low state, while the control signal en_q output from the AND circuit 2001 is brought into a high state. Therefore, the transistor 211 is on, the cathode of the light receiving element 1000 is connected to the ground voltage (gnd), and the quenching operation (Quench) is performed.

When the output signal $Vo_2$ of the delay circuit $210_2$ is brought into the high state at the time $t_{23}$, the output signals $Vo_1$ and $Vo_2$ are each brought into the high state. Therefore, the control signal en_q output from the AND circuit 2001 is brought into the low state, and the transistor 211 is brought into an off state in the quenching means 1003. Meanwhile, the control signal en_r output from the AND circuit 2002 is brought into the high state, and in the recharging means 1004, the transistor 212 is brought into the off state, and the transistor 213 is brought into the on state. Thus, the gate of the transistor 1001 is brought into the low state, the transistor 1001 is brought into the on state, and at the time $t_{23}$ as the falling timing of the clock signal ck, the recharging operation (Recharge) is performed to charge the light receiving element 1000 with the voltage Ve.

When charge of the light receiving element 1000 is started by the recharging operation, the voltage Vs increases according to the charge amount. When the voltage Vs crosses the threshold voltage Vth (time $t_{24}$), the inverter 1002 inverts the output signal $Vo_{iv}$ into the low state. In the example of FIG. 17, the time $t_{24}$ at which the output signal $Vo_{iv}$ is inverted is the timing after the time $t_{23}$ at which the recharging operation is started.

In the first embodiment described above, as described with reference to FIG. 11, a time period from the performance of the quenching operation at the time $t_{22}$ to the start of the recharging operation at the time $t_{23}$ corresponds to one period of the clock signal ck. Meanwhile, in the second modification of the first embodiment, the falling timing of the clock signal ck is further used. Therefore, the time period from the performance of the quenching operation at the time $t_{22}$ to the start of the recharging operation at the time $t_{23}$ corresponds to ½ of the period of the clock signal ck.

Therefore, an interval at which the output signal $Vo_{iv}$ is inverted by the inverter 1002 can be reduced for faster operation. Furthermore, for example, in a case where each processing is performed at a time interval similar to that of FIG. 11 described above, the frequency required for the clock signals ck is only ½ of that of FIG. 11, and power consumption relating to generation of the clock signals ck can be reduced.

Furthermore, according to the second modification of the first embodiment, as in the first embodiment described above, the delay amount to each of the quenching operation and the recharging operation is determined on the basis of the clock signal ck, and thus, the variations in the delay amount between the pixels 10 can be suppressed. In addition, the delay amount is determined on the basis of the clock signal ck, and thus, influence of the PVT variation, external noise, or the like in each element on the delay amount can be suppressed. Therefore, application of the second modification of the first embodiment makes it possible to stably control the operation of the light receiving element 1000.

At the next rising timing (time $t_{25}$) of the clock signal ck, the output signal $Vo_1$ of the delay circuit $210_1$ is brought into the low state. Meanwhile, the output signal $Vo_2$ of the delay circuit $210_2$ is in the high state at the time $t_{25}$, and thus, the control signal en_r output from the AND circuit 2002 is brought into the low state. In other words, at the time $t_{25}$, the control signals en_q and en_r are brought into the low state, and the transistors 211, 212, and 213 are brought into the initial state (Reset).

At the next falling timing (time $t_{26}$) of the clock signal ck, the output signal $Vo_2$ of the delay circuit $210_2$ is brought into the low state.

Note that, in the above description, at the time $t_{25}$ at which the output signal $Vo_1$ of the delay circuit $210_1$ is brought into the low state, each of the transistors 211, 212, and 213 relating to the quenching operation and the recharging operation is in, but is not limited to, the initial state. In other words, the timing to bring each of the transistors 211, 212, and 213 into the initial state may differ depending on the settling time for the voltage Vs. In an example, it is considered to perform initialization of the transistors 211, 212, and 213 at the time $t_{26}$, in a case where the recharging operation is completed from the time $t_{25}$ until the time $t_{26}$ at which the next clock signal ck rises. In this case, the logic circuit 201*d* is changed to have a corresponding configuration.

Third Modification of First Embodiment

Next, a third modification of the first embodiment will be described. The first embodiment and the first and second modifications of the first embodiment which are described above each have a configuration in which the voltage Vs is read from the cathode of the light receiving element 1000 and supplied to the inverter 1002. Meanwhile, the third modification of the first embodiment has a configuration in which the voltage Vs is read from the anode of the light receiving element 1000 and supplied to the inverter 1002.

Figure 18:
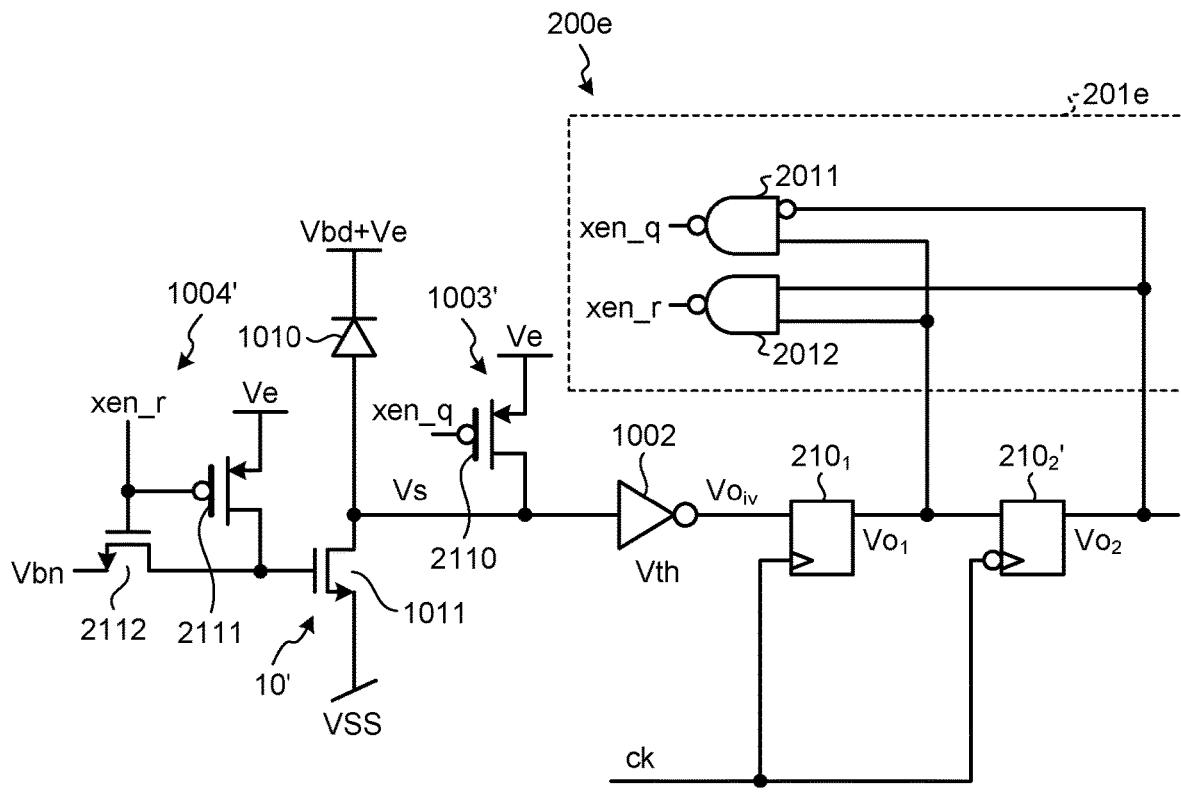
FIG. 18 is a diagram illustrating an example of a configuration of an element control unit according to a third modification of the first embodiment.

FIG. 18 is a diagram illustrating an example of a configuration of an element control unit according to the third modification of the first embodiment. The configuration illustrated in FIG. 18 corresponds to the configuration according to the second modification of the first embodiment illustrated in FIG. 16.

In FIG. 18, a pixel 10' includes a light receiving element 1010, a transistor 1011 that is an N-channel MOS transistor, and the inverter 1002. The light receiving element 1010 corresponds to the light receiving element 1000 described above, and has a cathode that is connected to a voltage (Vbd+Ve) obtained by adding the voltage Ve to a positive voltage Vbd whose absolute value corresponds to the negative voltage (−Vbd) described above. The light receiving element 1010 has an anode that is connected to a drain of the transistor 1011. The transistor 1011 has a source that is connected to a predetermined voltage VSS. The voltage VSS may be, for example, a ground voltage.

The voltage Vs extracted from a connection point where the transistor 1011 and the anode of the light receiving element 1010 are connected is input to the inverter 1002. The inverter 1002 performs threshold determination on the voltage Vs by using the threshold voltage Vth, and inverts the output signal $Vo_{iv}$ when determining that the voltage Vs crosses the threshold voltage Vth.

An element control unit 200*e* includes a logic circuit 201*e*, the delay circuits $210_1$ and $210_2'$, quenching means 1003', and recharging means 1004'.

The output signal $Vo_{iv}$ output from the inverter 1002 is input to the delay circuit $210_1$. The delay circuit $210_1$ is a D-FF circuit that latches the input signal at the rising timing of the clock signal ck. The output signal $Vo_1$ output from the delay circuit $210_1$ is input to the delay circuit $210_2'$. The delay circuit $210_2'$ is a D-FF circuit that has the clock input terminal being the inverting input terminal and is configured to latch the input signal at the falling timing of the clock signal ck.

The output signals $Vo_1$ and $Vo_2$ output from the delay circuits $210_1$ and $210_2'$ are input to the logic circuit 201*e*. The logic circuit 201*e* includes NAND circuits 2011 and 2012. The NAND circuit 2011 has one input terminal that is the inverting input terminal configured to invert the input signal. The output signal $Vo_2$ output from the delay circuit $210_2$ is input to one input terminal (the inverting input terminal) of the NAND circuit 2011 and one input terminal of the NAND circuit 2012. Furthermore, the output signal $Vo_1$ output from the delay circuit $210_1$ is input to the other input terminal (the non-inverting input terminal) of the NAND circuit 2011 and the other input terminal of the NAND circuit 2012.

The NAND circuit 2011 outputs a negative AND of the output signal $Vo_2$ inverted and input to one input terminal and the output signal $Vo_1$ input to the other input terminal, as a control signal xen_q controlling the operation of the quenching means 1003'. Furthermore, the NAND circuit 2012 outputs a negative AND of the output signals $Vo_1$ and $Vo_2$ input to one and the other input terminals, as a control signal xen_r controlling the recharging means 1004'.

In the example of FIG. 18, the quenching means 1003' includes a transistor 2110 that is a P-channel MOS transistor. The transistor 2110 has a drain that is connected to a connection point where the anode of the light receiving element 1010 and the drain of the transistor 1011 are connected. The transistor 2110 has a source that is connected to the voltage Ve. The transistor 2110 has a gate to which the control signal xen_q is input.

Furthermore, in the example of FIG. 18, the recharging means 1004' includes a transistor 2111 that is a P-channel MOS transistor and a transistor 2112 that is an N-channel MOS transistor. The transistor 2112 has a source to which a predetermined bias voltage Vbn is supplied. A drain of the transistor 2112 is connected to a drain of the transistor 2111, and a gate of the transistor 1011 is connected to a connection point where the drain of the transistor 2112 is connected to the drain of the transistor 2111. The transistor 2111 has a source that is connected to the voltage Ve. The transistors 2111 and 2112 have gates to which the control signal xen_r is input.

The operation in the configuration illustrated in FIG. 18 is similar to the operation in the configuration of FIG. 16 corresponding to the configuration of FIG. 18. Therefore, to the operation of FIG. 18, the operation described using the timing chart of FIG. 17 corresponding to the configuration of FIG. 16 is applicable, and thus the description thereof is omitted here. As described above, the technology of the present disclosure is also applicable to a configuration in which the voltage Vs is read from the anode of the light receiving element 1010.

In the third modification of the first embodiment as well, as in the first embodiment described above, the delay amount to each of the quenching operation and the recharging operation is determined on the basis of the clock signal ck, and thus, the variations in the delay amount between the pixels 10' can be suppressed. In addition, the delay amount is determined on the basis of the clock signal ck, and thus, influence of the PVT variation, external noise, or the like in each element on the delay amount can be suppressed. Therefore, application of the third modification of the first embodiment makes it possible to stably control the operation of the light receiving element 1010.

Second Embodiment

Next, a second embodiment of the present disclosure will be described. In the first embodiment and the modifications thereof described above, the quenching operation and the recharging operation are each performed by the active method synchronized with the clock signal ck. Meanwhile, in the second embodiment, the quenching operation is performed by a passive method, and the recharging operation is performed by the active method synchronized with the clock signal ck.

Figure 19:
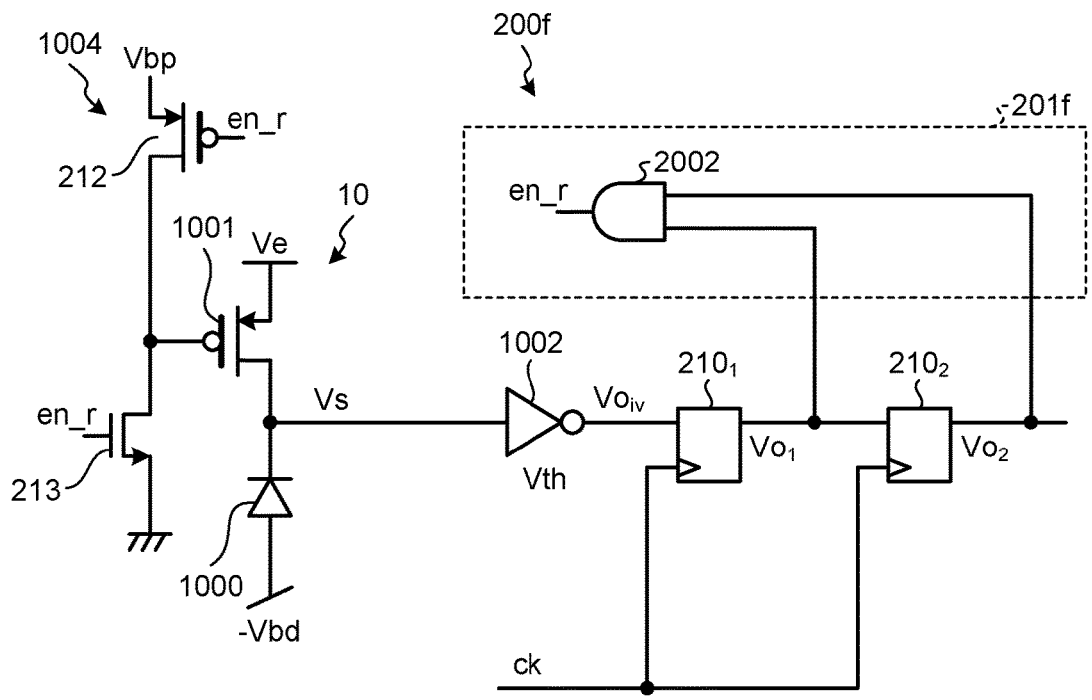
FIG. 19 is a diagram illustrating an example of a configuration of an element control unit according to a second embodiment.

FIG. 19 is a diagram illustrating an example of a configuration of an element control unit according to the second embodiment. The configuration illustrated in FIG. 19 is obtained, for example, by omitting the configuration relating to the quenching operation by the active method from the configuration according to the first embodiment illustrated in FIG. 10. More specifically, the element control unit 200f illustrated in FIG. 19 is obtained by omitting the quenching means 1003 (the transistor 211) from the configuration of FIG. 10.

Furthermore, a logic circuit 201f is obtained by omitting the AND circuit 2001 for outputting the control signal en_q controlling the quenching means 1003, from the logic circuit 201a of FIG. 10. The output signal Vo2 output from the delay circuit $210_2$ is input to one input terminal of the AND circuit 2002. In addition, the output signal Vo1 output from the delay circuit $210_1$ is input to the other input terminal of the AND circuit 2002. The output of the AND circuit 2002 is input to each of the gates of the transistors 212 and 213 included in the recharging means 1004.

Figure 20:
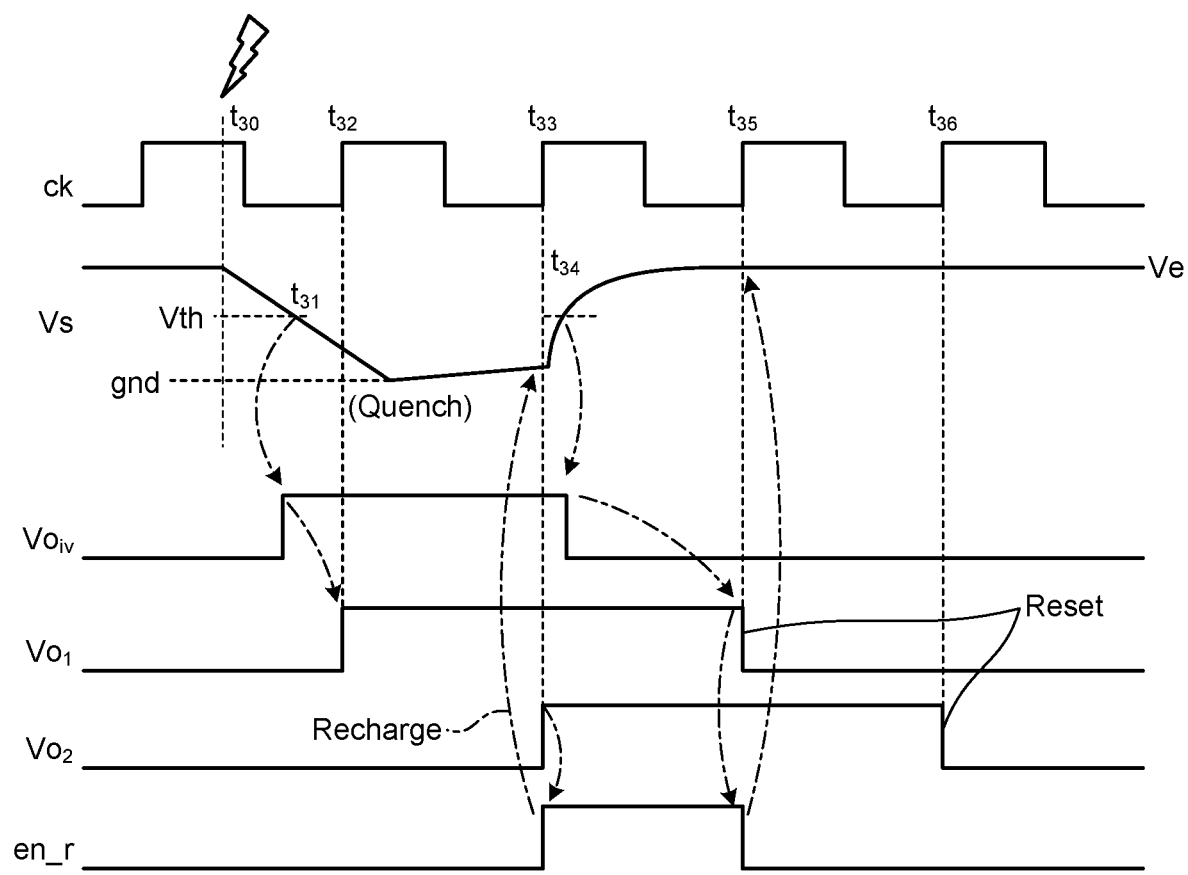
FIG. 20 is a timing chart illustrating an example of an operation according to the first embodiment.

FIG. 20 is a timing chart illustrating an example of operations performed by the configuration of FIG. 19, according to the first embodiment. In FIG. 20, the horizontal axis represents time, and in the vertical direction, the clock signal ck, the voltage Vs, the output signals $Vo_{iv}$, $Vo_1$, and $Vo_2$, and the control signal en_r are represented.

As illustrated in FIG. 20, in an initial state before a photon is incident on the light receiving element 1000 at a time $t_{30}$, the voltage Vs being in a high state is inverted by the inverter 1002, the output signal $Vo_{iv}$ of the inverter 1002 is in a low state, and the output signals $Vo_1$ and $Vo_2$ of the delay circuits $210_1$ and $210_2$ are each in a low state. The output signals $Vo_1$ and $Vo_2$ are each in the low state, and thus, the control signal en_r is in a low state.

In FIG. 20, when the photon is incident on the light receiving element 1000 at the time $t_{30}$, a current flows through the light receiving element 1000 due to the avalanche multiplication, and the voltage Vs drops with the current flow. When the voltage Vs crosses the threshold voltage Vth in the inverter 1002 at a time $t_{31}$, the inverter 1002 inverts the output signal $Vo_{iv}$ into the high state. The high state of the output signal $Vo_{iv}$ is latched in the delay circuit $210_1$ at the next rising timing (time $t_{32}$) of the clock signal ck, and the output signal $Vo_1$ of the delay circuit $210_1$ is brought into the high state. In other words, the delay circuit $210_1$ delays the output signal $Vo_{iv}$ output from the inverter 1002 according to the clock signal ck.

The output signal $Vo_1$ of the delay circuit $210_1$ is latched in the delay circuit $210_2$ at the next rising timing (time $t_{33}$) of the clock signal ck, and the output signal $Vo_2$ of the delay circuit $210_2$ is brought into the high state. In other words, the delay circuit $210_2$ further delays the output signal $Vo_{iv}$ of the inverter 1002 having been delayed according to the clock signal ck in the delay circuit $210_1$, according to the clock signal ck.

Here, according to the current flowing through the transistor 1001 due to the avalanche multiplication in the light receiving element 1000, a voltage drop occurs due to the source-drain resistance of the transistor 1001. This voltage drop causes a decrease in voltage applied to the light receiving element 1000 to the voltage (−Vdb), and the quenching operation by the passive method is performed.

When the output signal $Vo_1$ of the delay circuit $210_2$ is brought into the high state at the time $t_{33}$, the output signals $Vo_1$ and $Vo_2$ are each brought into the high state. Therefore, the control signal en_r output from the AND circuit 2002 is brought into the high state, and in the recharging means 1004, the transistor 212 is brought into the off state, and the transistor 213 is brought into the on state. Thus, the gate of the transistor 1001 is brought into the low state, the transistor 1001 is brought into the on state, and at the time $t_{33}$, the recharging operation (Recharge) is performed to charge the light receiving element 1000 with the voltage Ve.

When charge of the light receiving element 1000 is started by the recharging operation, the voltage Vs increases according to the charge amount. When the voltage Vs crosses the threshold voltage Vth (time $t_{34}$), the inverter 1002 inverts the output signal $Vo_{iv}$ into the low state. In the example of FIG. 20, the time $t_{34}$ at which the output signal $Vo_{iv}$ is inverted is the timing after the time $t_{33}$ at which the recharging operation is started.

At the next rising timing (time $t_{35}$) of the clock signal ck, the output signal $Vo_1$ of the delay circuit $210_1$ is brought into the low state. Meanwhile, the output signal $Vo_2$ of the delay circuit $210_2$ is in the high state at the time $t_{35}$, and thus, the control signal en_r output from the AND circuit 2002 is brought into the low state. In other words, at the time $t_{35}$, the control signals en_q and en_r are brought into the low state, and the transistors 211, 212, and 213 are brought into the initial state (Reset).

At the next rising timing (time $t_{36}$) of the clock signal ck, the output signal $Vo_2$ of the delay circuit $210_2$ is brought into the low state.

Note that, in the above description, at the time $t_{35}$ at which the output signal $Vo_1$ of the delay circuit $210_1$ is brought into the low state, each of the transistors 212 and 213 relating to a reset operation is in, but is not limited to, the initial state. In other words, the timing to bring each of the transistors 212 and 213 into the initial state may differ depending on the settling time for the voltage Vs. In an example, it is considered to perform initialization of the transistors 212 and 213 at the time $t_{36}$, in a case where the recharging operation is completed from the time $t_{35}$ until the time $t_{36}$ at which the next clock signal ck rises. In this case, the logic circuit 201f is changed to have a corresponding configuration.

In the configuration according to the second embodiment, no forcible quenching operation synchronized with the clock signal ck is performed, and thus, the quenching operation requires time as compared with the configuration according to the first embodiment described above. Therefore, in the configuration according to the second embodiment, a time required for completion of the recharging operation after the photon is incident on the light receiving element 1000 is shorter than that required for performance of the recharging operation by the passive method but is longer than that in the configuration according to the first embodiment described above.

Meanwhile, in the configuration according to the second embodiment, the configuration for performing the quenching operation by the active method (e.g., the transistor 211 and the AND circuit 2001 in FIG. 11) can be omitted. Therefore, the configuration according to the second embodiment can be achieved by a simpler configuration than the configuration according to the first embodiment described above. Thus, the area of the circuit upon implementation can be further reduced as compared with that of the configuration according to the first embodiment.

Furthermore, in the second embodiment as well, as in the first embodiment and the like described above, the delay amount to the recharging operation is determined on the basis of the clock signal ck, and thus, the variations in the delay amount between the pixels 10 can be suppressed. In addition, the delay amount is determined on the basis of the clock signal ck, and thus, influence of the PVT variation, external noise, or the like in each element on the delay amount can be suppressed. Therefore, application of the second embodiment makes it possible to stably control the operation of the light receiving element 1000.

Third Embodiment

Figure 21:
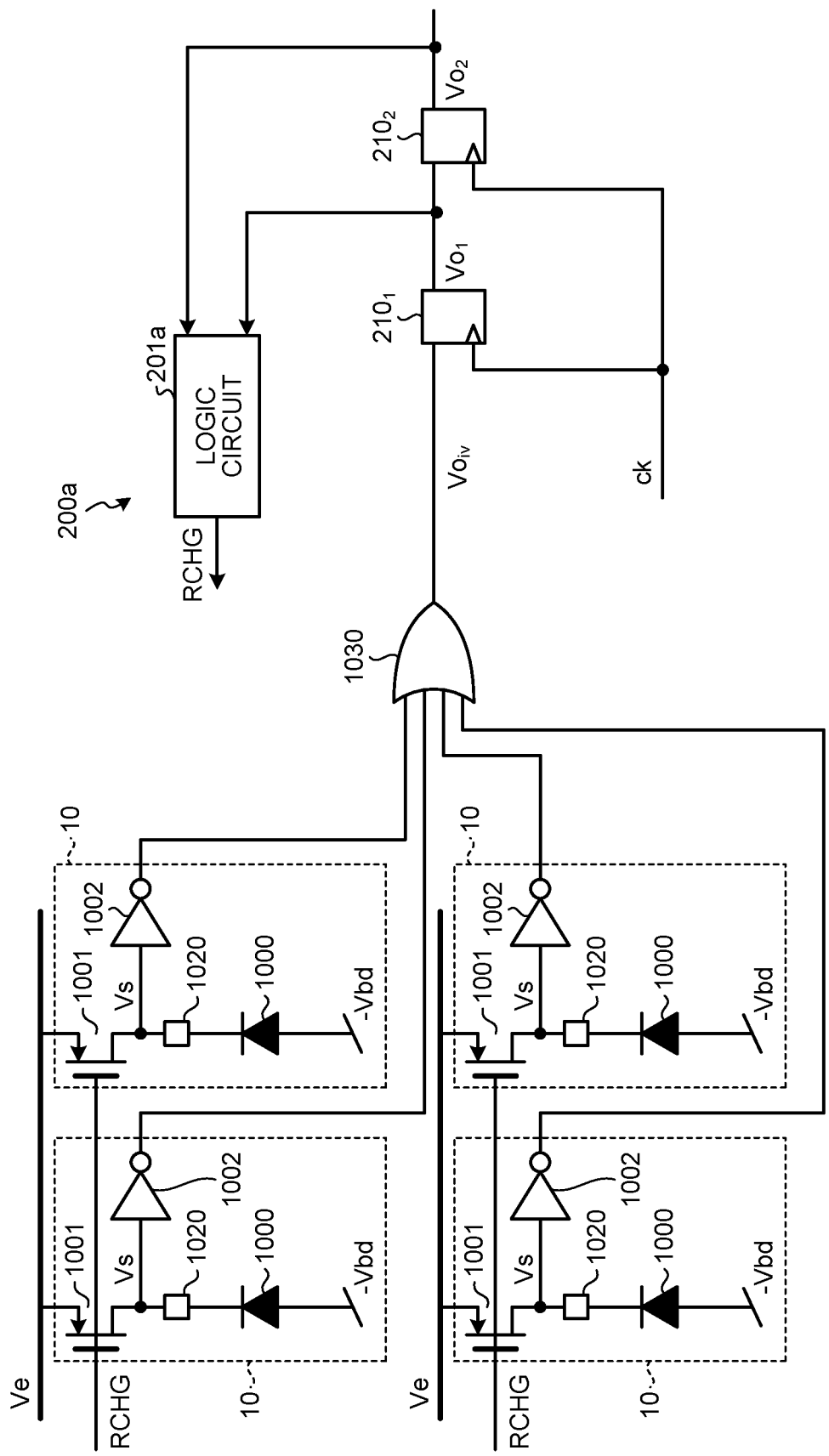
FIG. 21 is a diagram illustrating an example of a configuration according to a third embodiment.

Next, a third embodiment of the present disclosure will be described. The third embodiment is an example in which the element control unit according to the present disclosure is shared between a plurality of pixels 10. FIG. 21 is a diagram illustrating an example of a configuration according to the third embodiment. FIG. 21 illustrates the example in which the element control unit 200a described in the first embodiment is applied to the third embodiment.

In FIG. 21, each output signal $Vo_{iv}$ output from the inverter 1002 of each pixel 10 is input to an OR circuit 1030. An output of the OR circuit 1030 is input to an input terminal of the delay circuit $210_1$ of the element control unit 200a. The delay circuit $210_1$ latches the output signal $Vo_{iv}$ input from the OR circuit 1030 at the rising timing of the clock signal ck, and outputs the output signal $Vo_1$ at the next rising timing of the clock signal ck. The output signal $Vo_1$ is input to the input terminal of the delay circuit $210_2$. The delay circuit $210_2$ latches the input output signal $Vo_1$ and outputs the output signal $Vo_1$ at the next rising timing of the clock signal ck.

The output signal $Vo_1$ output from the delay circuit $210_1$ and the output signal $Vo_1$ output from the delay circuit $210_2$ are input to the logic circuit 201a. As described with reference to FIGS. 10 and 11 and the like, the logic circuit 201a generates the control signal en_q for controlling the quenching operation and the control signal en_r for controlling the recharging operation, on the basis of the output signals Vo1 and Vo2, and supplies the generated control signals to each pixel 10.

Note that, in the example of FIG. 21, for the sake of explanation, the control signal en_q is omitted and the control signal en_r is represented as a signal RCHG.

The signal RCHG is supplied to the pixels 10 in common. In each of the pixels 10, the operation of the transistor 1001 is controlled by the recharging means 1004, which is not illustrated, according to the signal RCHG, and the recharging operation for each light receiving element 1000 is performed.

In the configuration illustrated in FIG. 21, the OR circuit 1030 outputs an output signal $Vo_{iv}$ output from an inverter 1002 of a pixel 10 on which the photon is incident first in time, of the pixels 10. Therefore, for the respective pixels 10 that are configured to input the output signal $Vo_{iv}$ of the inverters 1002 to the OR circuit 1030, the quenching operation and the recharging operation are performed in synchronization with a pixel 10 on which the photon is incident first in time, of the pixels 10.

As described above, sharing the control signals for controlling the quenching operation and the recharging operation between the plurality of pixels 10 makes it possible to reduce the number of the element control units 200a and reduce the area of the circuit upon implementation.

Figure 22:
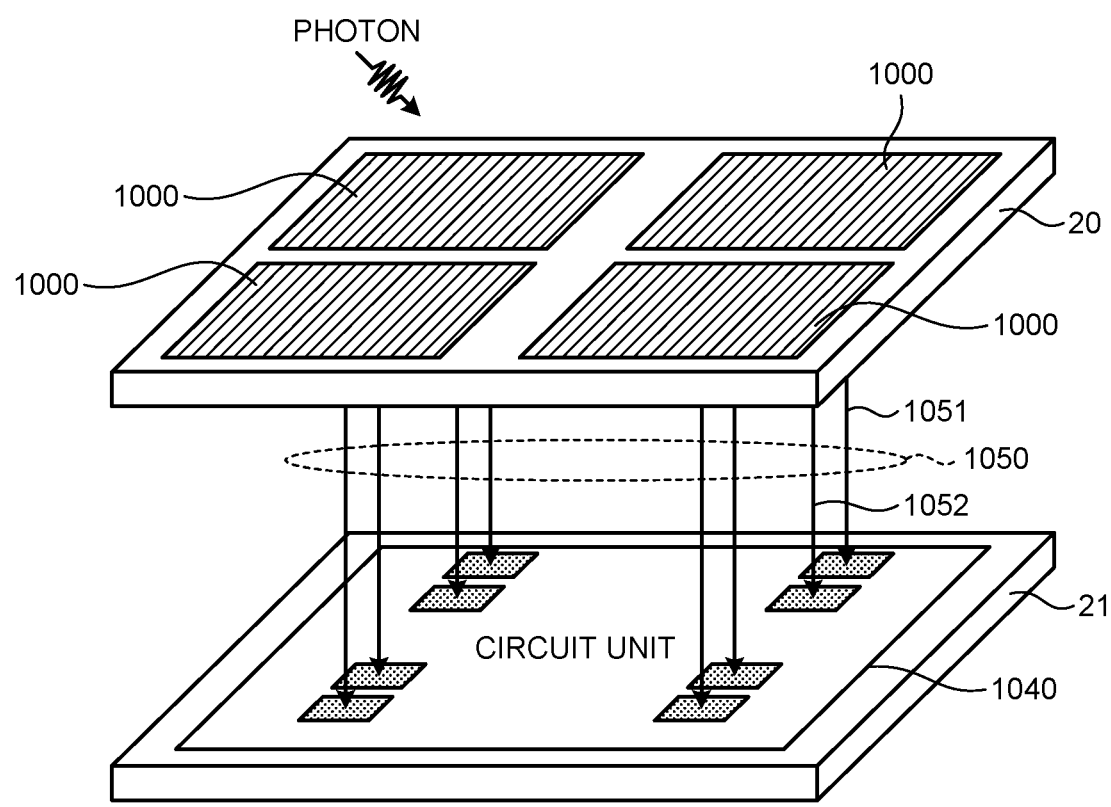
FIG. 22 is a diagram illustrating an example of a configuration in which pixels are separated into a light receiving chip and a logic chip, applicable to the third embodiment.

Note that, in each pixel 10 illustrated in FIG. 21, the light receiving element 1000 is configured to be separated from the other elements (e.g., the transistor 1001 and the inverter 1002) included in the pixel 10 via a coupling portion 1020. FIG. 22 is a diagram illustrating an example of a configuration, applicable to the third embodiment, in which when the control signals for controlling the quenching operation and the recharging operation are shared between four pixels 10 of two pixels by two pixels, the pixels 10 are separated into the light receiving chip 20 and the logic chip 21 (see FIG. 6).

In the example of FIG. 22, as in the example of FIG. 6 described above, a lower surface of the light receiving chip 20 and an upper surface of the logic chip 21 are bonded to each other. The light receiving elements 1000 are arranged so that a surface of each light receiving element 1000 on which the photon is incident is located on the upper surface of the light receiving chip 20. Meanwhile, for example, the element control unit 200a, the transistor 1001 and the inverter 1002 that are included in each pixel 10, the quenching means 1003, and the recharging means 1004 are arranged in a circuit unit 1040 on the logic chip 21.

The cathode and the anode of the light receiving element 1000 are connected to the circuit unit 1040 via connection portions 1051 and 1052 for intership connection 1050. At this time, the connection portion 1051 that connects the cathode of the light receiving element 1000 to the circuit unit 1040 corresponds to the coupling portion 1020 described above. For example, it is preferable to apply copper-copper connection (CCC) to the coupling portion 1020.

In such a configuration, sharing the control signals for controlling the quenching operation and the recharging operation between the plurality of pixels 10 makes it possible to for example, eliminate the need for arranging the element control unit 200a in regions in the circuit unit 1040 on the logic chip 21 corresponding one-to-one to arrangement positions of the light receiving elements 1000 on the light receiving chip 20. This makes it possible to have a sufficient space in layout in the circuit unit 1040. This facilitates layout design and the like in the logic chip 21, for example, in a case where the area of the light receiving surface of each light receiving element 1000 is reduced enabling high-density arrangement of the light receiving elements 1000.

Fourth Embodiment

Figure 23:
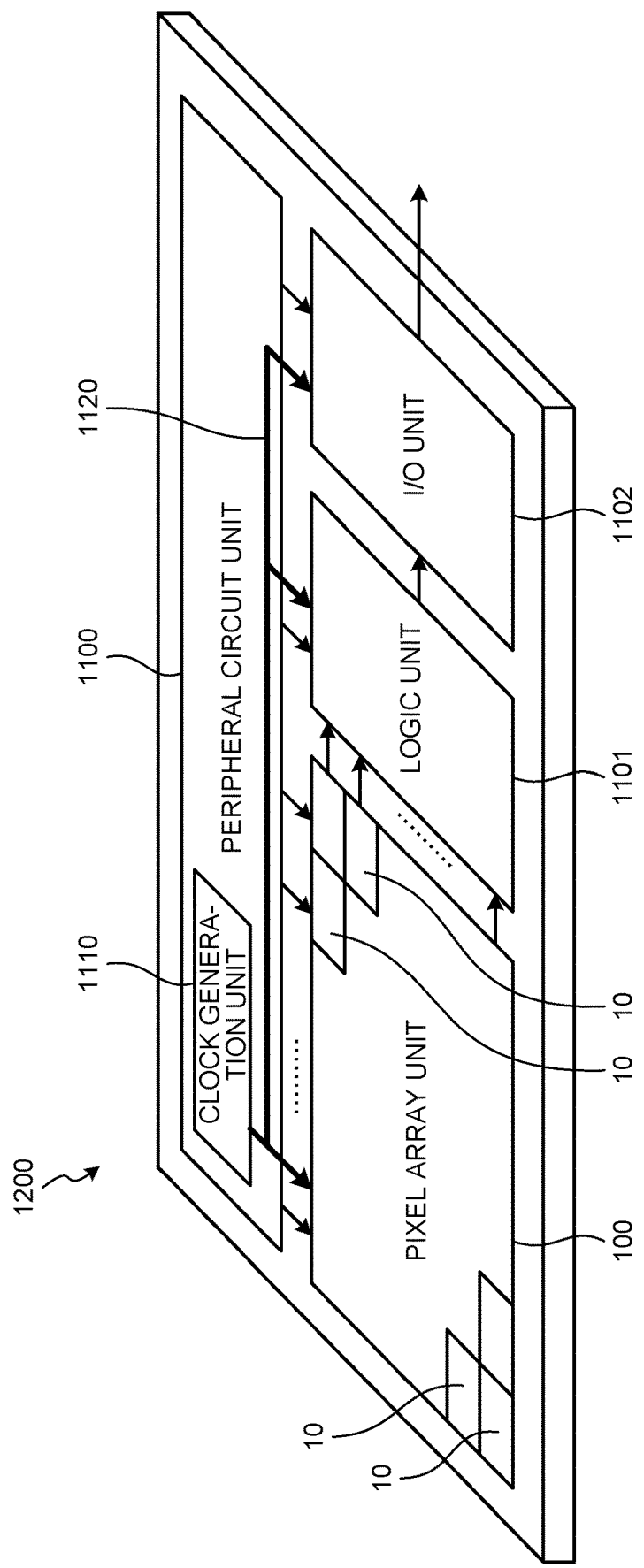
FIG. 23 is a diagram illustrating an example of a configuration of a light receiving IC applicable to the distance measurement device according to a fourth embodiment.

Next, a fourth embodiment of the present disclosure will be described. The fourth embodiment is an example in which the distance measurement device 1 to which the technology of the present disclosure is applied, described with reference to, for example, FIGS. 3 to 6 is formed on a single-layer semiconductor chip. FIG. 23 is a diagram illustrating an example of a light receiving integrated circuit (IC) that is applicable to the distance measurement device according to the fourth embodiment.

In FIG. 23, a light receiving IC 1200 according to the fourth embodiment corresponds to, for example, the light receiving unit 302 of FIG. 1, and includes the configuration of the distance measurement device 1 described with reference to FIGS. 3 and 4. The light receiving IC 1200 is configured by arranging the pixel array unit 100, a peripheral circuit unit 1100, a logic unit 1101, and an input/output (I/O) unit 1102 on the single-layer semiconductor chip.

As described above, the pixel array unit 100 includes the plurality of pixels 10 arranged in a matrix. In the example of FIG. 23, for example, each pixel 10, including the element control unit 200a, the quenching means 1003, and the recharging means 1004, is included in the pixel array unit 100. The element control unit 200a may be provided in each pixel 10 or one element control unit 200a may be provided for a plurality of pixels 10.

The logic unit 1101 corresponds to, for example, the distance measurement processing unit 101 in FIG. 4. For example, the logic unit 1101 converts, for example, each output signal Vo$_2$ supplied from each pixel 10 of the pixel array unit 100, into the time information indicating the timing at which light is received by the light receiving element 1000 included in the pixel 10. The logic unit 1101 further generates the histogram on the basis of the time information obtained by converting each output signal Vo$_2$, performs predetermined calculation on the basis of data in the generated histogram, and calculates, for example, the distance information. The distance information calculated by the logic unit 1101 is output as output data to the outside of the light receiving IC 1200, for example, via the I/O unit 1102 corresponding to the I/F 106 in FIG. 4.

In FIG. 23, the peripheral circuit unit 1100 includes a clock generation unit 1110 corresponding to the clock generation unit 104 illustrated in FIG. 4. The clock generation unit 1110 generates the clock signal ck described above, and supplies the generated clock signal ck to each unit of the light receiving IC 1200 via a path 1120. Furthermore, the peripheral circuit unit 1100 includes, for example, the pixel control unit 102, the general control unit 103, and the light emission timing control unit 105 which are illustrated in FIG. 4. The peripheral circuit unit 1100 including the clock generation unit 1110 and the pixel control unit 102, the general control unit 103, and the light emission timing control unit 105 which are illustrated in FIG. 4, is laid out on the light receiving IC 1200.

As described above, in the fourth embodiment, the clock generation unit 1110 and the pixel array unit 100 are arranged on the light receiving IC 1200, and the clock signal ck generated by the clock generation unit 1110 is supplied to the pixel array unit 100. In the pixel array unit 100, the clock signal ck is supplied to each element control unit 200a corresponding to each pixel 10.

In each pixel 10, the quenching operation and the recharging operation of the light receiving element 1000 are controlled on the basis of the clock signal ck. Therefore, as compared with the quenching operation and the recharging operation that are delayed by analog elements, there is no need for a configuration such as countermeasures against the PVT variations affecting the delay amount of the analog delay. In addition, the influence of the external noise is also suppressed, and, for example, it is thus possible to suppress variations in the dynamic range of the voltage Vs extracted from the light receiving element 1000. Therefore, application of the fourth embodiment makes it possible to stably control the operation of the light receiving element 1000, enabling the distance measurement with higher accuracy.

Fifth Embodiment

Figure 24:
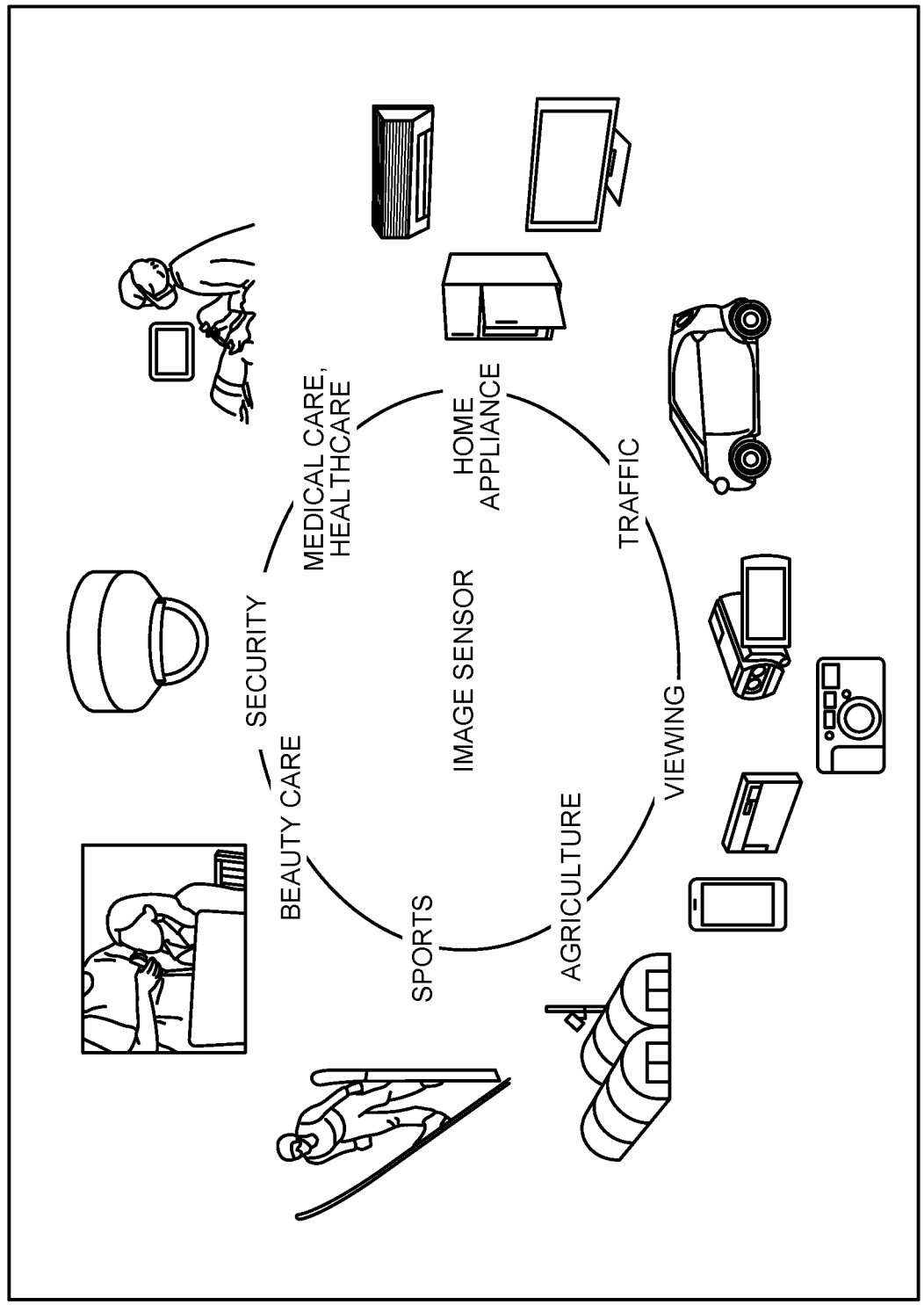
FIG. 24 is a diagram illustrating use examples of the distance measurement device according to a fifth embodiment to which the first embodiment and the modifications thereof, the second embodiment, the third embodiment, and the fourth embodiment are applicable.

Next, as a fifth embodiment of the present disclosure, application examples of the first embodiment and modifications thereof, the second embodiment, the third embodiment, and the fourth embodiment of the present disclosure will be described. FIG. 24 is a diagram illustrating use examples of the distance measurement device 1 according to the fifth embodiment to which the first embodiment and the modifications thereof, the second embodiment, the third embodiment, and the fourth embodiment are applicable.

The distance measurement device 1 described above is available for, for example, various cases of sensing light such as visible light, infrared light, ultraviolet light, and X-rays, as described below.

A device that captures an image for viewing, such as a digital camera or a portable device with a camera function.

A device used for traffic, such as a car sensor capturing an image of forward, backward, or peripheral position of a car, inside a car, or the like, for safety driving such as automatic stop, or for recognition of a state of a driver, a monitoring camera monitoring a running vehicle or a road, or a distance measuring sensor measuring a distance between vehicles or the like.

A device used for a home appliance, such as a TV set, refrigerator, or air conditioner, that captures a user's gesture and is operated according to the gesture.

A device used for medical care or healthcare, such as an endoscope or a device that performs angiography by receiving infrared light.

A device used for security, such as a monitoring camera for crime prevention or a camera for person identification.

A device used for beauty care, such as a skin measurement device capturing a skin image or a microscope capturing a scalp image.

A device used for sports, such as an action camera or a wearable camera for sports or the like.

A device used for agriculture, such as a camera for monitoring conditions of fields and crops.

[Further Application Examples of Technology According to Present Disclosure]

(Example of Application to Mobile Body)

The technology according to the present disclosure may be further applied to devices mounted on various moving bodies, such as automobiles, electric vehicles, hybrid electric vehicles, motorcycles, bicycles, personal mobility vehicles, airplanes, drones, ships, and robots.

Figure 25:
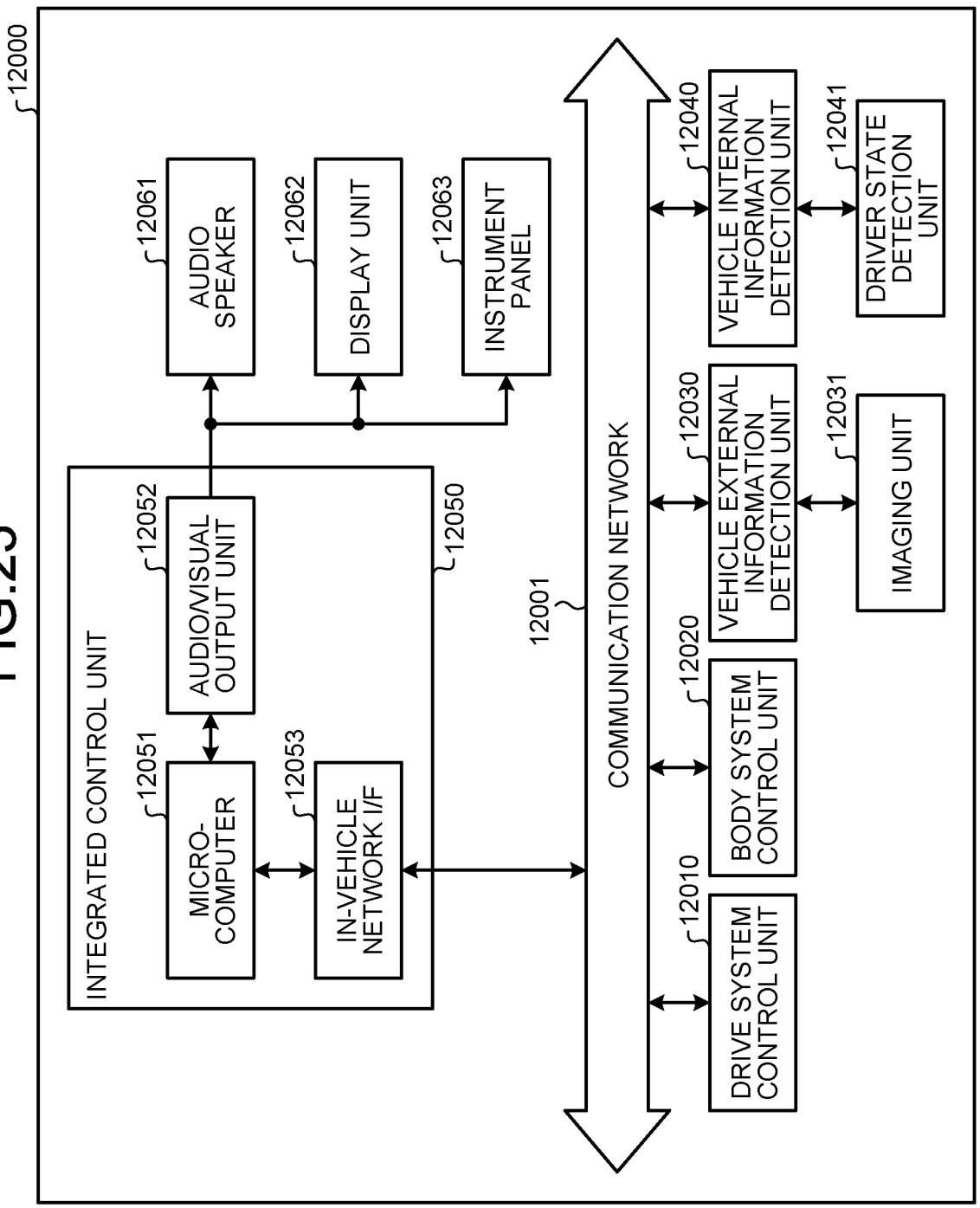
FIG. 25 is a block diagram illustrating a schematic configuration example of a vehicle control system as an example of a moving body control system to which the technology according to the present disclosure is applicable.

FIG. 25 is a block diagram illustrating a schematic configuration example of a vehicle control system as an example of a moving body control system to which the technology according to the present disclosure is applicable.

A vehicle control system 12000 includes a plurality of electronic control units connected via a communication network 12001. In the example illustrated in FIG. 25, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio/visual output unit 12052, and an in-vehicle network interface (I/F) 12053 are illustrated.

The drive system control unit 12010 controls the operation of devices relating to the drive system of the vehicle according to various programs. For example, the drive system control unit 12010 functions as a control device for a drive force generation device configured to generate a drive force of the vehicle such as an internal combustion engine or a driving motor, a drive force transmission mechanism configured to transmit the drive force to wheels, a steering mechanism configured to adjust a steering angle of the vehicle, a braking device configured to generate a braking force of the vehicle, and the like.

The body system control unit 12020 controls operations of various devices mounted on the vehicle body according to various programs. For example, the body system control unit 12020 functions as a control device for a keyless entry system, smart key system, power window device, or various lamps such as a headlamp, back lamp, brake lamp, blinker, or fog lamp. In this case, the body system control unit 12020 is configured to receive input of radio waves transmitted from a portable device substituting for a key, or signals of various switches. The body system control unit 12020 receives the input of these radio waves or signals and controls a door lock device, a power window device, a lamp, and the like of the vehicle.

The vehicle external information detection unit 12030 detects information outside the vehicle on which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing or distance detection processing for a person, vehicle, obstacle, sign, character on a road surface, or the like on the basis of the received image. For example, the vehicle external information detection unit 12030 performs image processing on the received image, and performs object detection processing or distance detection processing on the basis of a result of the image processing.

The imaging unit 12031 is an optical sensor configured to receive light and output an electric signal corresponding to the amount of light received. The imaging unit 12031 is operable to output the electric signal as an image or to output the electric signal as distance measurement information. Furthermore, the light received by the imaging unit 12031 may be visible light or invisible light such as infrared light.

The vehicle internal information detection unit 12040 detects information inside the vehicle. For example, a driver state detection unit 12041 configured to detect the state of the driver is connected to the vehicle internal information detection unit 12040. The driver state detection unit 12041 may include, for example, a camera to image the driver, and the vehicle internal information detection unit 12040 may calculate the degree of fatigue or degree of concentration of the driver or may determine whether the driver is dozing off, on the basis of detected information input from the driver state detection unit 12041.

The microcomputer 12051 is configured to calculate a control target value for the drive force generation device, steering mechanism, or braking device on the basis of the information inside and outside the vehicle acquired by the vehicle external information detection unit 12030 or the vehicle internal information detection unit 12040, and output a control command to the drive system control unit 12010. Specifically, for example, the microcomputer 12051 is configured to execute cooperative control to achieve the function of advanced driver assistance system (ADAS), including vehicle collision avoidance or impact mitigation, following on the basis of a distance between vehicles, driving while maintaining vehicle speed, vehicle collision warning, vehicle lane departure warning, and the like.

Furthermore, the microcomputer 12051 controls the drive force generation device, the steering mechanism, the braking device, or the like on the basis of information around the vehicle acquired by the vehicle external information detection unit 12030 or the vehicle internal information detection unit 12040, for the cooperative control to achieve autonomous driving or the like without depending on the driver's operation.

Furthermore, the microcomputer 12051 is configured to output a control command to the body system control unit 12020, on the basis of the information outside the vehicle acquired by the vehicle external information detection unit 12030. For example, the microcomputer 12051 is configured to execute the cooperative control for antidazzle such as by controlling the headlamps according to the position of a preceding vehicle or oncoming vehicle detected by the vehicle external information detection unit 12030 and switching the headlamps from a high beam to a low beam.

The audio/visual output unit 12052 transmits an output signal of at least one of voice or an image to an output device configured to visually or audibly notifying an occupant of the vehicle or the outside of the vehicle of information. In the example of FIG. 25, an audio speaker 12061, a display unit 12062, and an instrument panel 12063 are illustrated as the output device. The display unit 12062 may include, for example, at least one of an on-board display and a head-up display.

Figure 26:
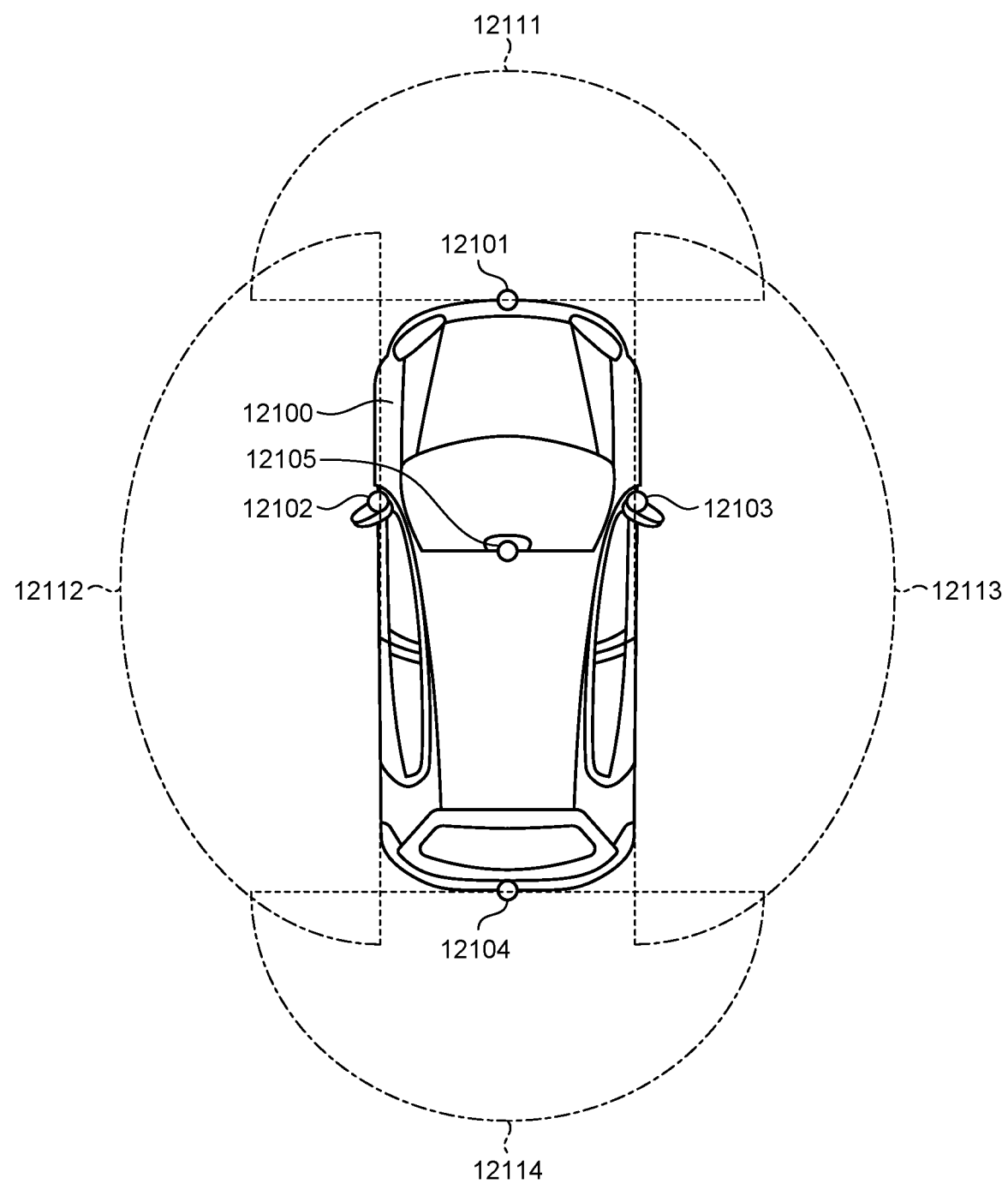
FIG. 26 is a diagram illustrating an example of installation positions of an imaging unit.

FIG. 26 is a diagram illustrating an example of installation positions of the imaging unit 12031. In FIG. 26, a vehicle 12100 includes imaging units 12101, 12102, 12103, 12104, and 12105 as the imaging unit 12031.

The imaging units 12101, 12102, 12103, 12104, and 12105 are provided on the vehicle 12100, at positions, such as a front nose, side mirrors, a rear bumper, a back door, and the upper side of a windshield on a side of a vehicle interior. The imaging unit 12101 that is provided at the front nose and the imaging unit 12105 that is provided at the upper side of the windshield on the side of the vehicle interior each mainly acquire an image of an area in front of the vehicle 12100. The imaging units 12102 and 12103 that are provided at the side mirrors each mainly acquire an image captured from a side of the vehicle 12100. The imaging unit 12104 that is provided at the rear bumper or the back door mainly acquires an image of an area in back of the vehicle 12100. The images of the areas in front of the vehicle 12100 that are acquired by the imaging units 12101 and 12105 are mainly used to detect the preceding vehicle, the pedestrian, the obstacle, a traffic light, the traffic sign, a lane, or the like.

Note that FIG. 26 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the respective side mirrors, and an imaging range 12114 indicates an imaging range of the imaging unit 12104 provided at the rear bumper or back door. For example, image data captured by the imaging units 12101 to 12104 are superposed on each other, and an overhead view image of the vehicle 12100 as viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having a pixel for phase difference detection.

For example, the microcomputer 12051 is configured to obtain a distance to each three-dimensional object in the imaging ranges 12111 to 12114 and a temporal change in the distance (relative speed with respect to the vehicle 12100) on the basis of the distance information obtained from the imaging units 12101 to 12104, and extract, in particular, a three-dimensional object nearest on a travel path of the vehicle 12100 and traveling at a predetermined speed (e.g., 0 km/h or more) in substantially the same direction as the vehicle 12100, as the preceding vehicle. Furthermore, the microcomputer 12051 is configured to set a distance between the vehicles to be secured in advance with respect to the preceding vehicle, and perform automatic brake control (including following stop control), automatic acceleration control (including following start control), and the like. As described above, it is possible to perform cooperative control for the autonomous driving or the like without depending on the operation of the driver.

For example, on the basis of the distance information obtained from the imaging units 12101 to 12104, the microcomputer 12051 classifies three-dimensional object data about the three-dimensional objects into a two-wheeled motorcycle, ordinary motor vehicle, large-sized motor vehicle, pedestrian, power pole, and the other three-dimensional objects, extracts the classified three-dimensional object data, for use in automatic obstacle avoidance. For example, the microcomputer 12051 identifies the obstacles around the vehicle 12100 between an obstacle that is visible to a driver of the vehicle 12100 and an obstacle which is difficult for the driver to see. Then the microcomputer 12051 determines a collision risk that indicates the degree of risk of collision with each obstacle, and in a case where the risk of collision has a value equal to or more than a set value and there is a possibility of collision, the microcomputer 12051 outputs warning to the driver via the audio speaker 12061 or the display unit 12062, or performs forced deceleration or evasive steering via the drive system control unit 12010, performing driving assistance for collision avoidance.

At least one of the imaging units 12101 to 12104 may be an infrared camera detecting infrared light. For example, the microcomputer 12051 is configured to recognize the pedestrian by determining whether the pedestrian is shown in an image captured by the imaging units 12101 to 12104. Such pedestrian recognition is performed, for example, according to a procedure for extracting feature points in the images captured by the imaging units 12101 to 12104 as the infrared cameras, and a procedure for determining whether a sequence of the feature points indicating a contour of an object is the pedestrian by performing pattern matching. When the microcomputer 12051 determines that the pedestrian is shown in the images captured by the imaging units 12101 to 12104 and recognizes the pedestrian, the audio/visual output unit 12052 controls the display unit 12062 to display a rectangular contour line superimposed on the recognized pedestrian to emphasize the recognized pedestrian. Furthermore, the audio/visual output unit 12052 may control the display unit 12062 to display an icon or the like indicating the pedestrian, at a desired position.

An example of the vehicle control system to which the technology according to the present disclosure is applicable has been described above. The technology according to the present disclosure is applicable to, for example, the imaging unit 12031 of the configurations described above. Specifically, it is possible to apply the distance measurement device 1 to which the first embodiment and modifications thereof, the second embodiment, the third embodiment, and the fourth embodiment which are described above are applicable, to the imaging unit 12031. Application of the technology according to the present disclosure to the imaging unit 12031 makes it possible to more stably perform distance measurement.

Note that the effects described herein are merely examples, and the present invention is not limited to these effects and may have other effects.

Note that the present technology may also have the following configurations.

(1) A measurement device comprising:
a light receiving element that has flow of current caused by an avalanche multiplication caused according to a photon incidence while being charged to a predetermined potential and is returned to the charged state by a recharge current;
a detection unit that is configured to detect the current and invert an output signal when the current crosses a threshold value;
a delay unit that is configured to delay timing of the inversion detected by the detection unit, according to a clock; and
a control unit that is configured to control an operation of the light receiving element, based on the timing of the inversion delayed by the delay unit.

(2) The measurement device according to (1), wherein
the control unit
controls supply of the recharge current to the light receiving element, based on the timing of the inversion delayed by the delay unit.

(3) The measurement device according to (1) or (2), wherein
the control unit
controls occurrence of the avalanche multiplication in the light receiving element, based on the timing of the inversion delayed by the delay unit.

(4) The measurement device according to any one of (1) to (3), wherein
the delay unit includes:
a first delay unit that is configured to delay the timing of the inversion according to the clock; and
a second delay unit that is configured to further delay the timing of the inversion delayed by the first delay unit according to the clock, and
the control unit
controls the operation of the light receiving element based on the timing of the inversion delayed by the first delay unit and the timing of the inversion further delayed by the second delay unit.

(5) The measurement device according to (4), wherein
the first delay unit
delays the timing of the inversion according to one of rising and falling of the clock, and
the second delay unit further delays the timing of the inversion delayed by the first delay unit, according to the other of the rising and falling of the clock, different from the one of the rising and falling of the clock.

(6) The measurement device according to (4), wherein
the second delay unit includes
a plurality of third delay units that are configured to further sequentially delay the timing of the inversion delayed by the first delay unit, according to the clock, and
the control unit
controls the operation of the light receiving element, based on the timing of the inversion delayed by the first delay unit and the timing of the inversion further delayed by one of the plurality of third delay units.

(7) The measurement device according to any one of (1) to (6) further comprising
a first substrate and a second substrate on which the first substrate is stacked, wherein
the light receiving element is arranged on the first substrate, and
the detection unit, the delay unit, and the control unit are arranged on the second substrate.

(8) The measurement device according to any one of (1) to (7), wherein
the light receiving element
is configured as an element array that has an arrangement of a plurality of elements on which photons are independently incident, and
the control unit
controls operation of each of the plurality of elements in common in units of two or more elements included in the plurality of elements.

(9) The measurement device according to (8), wherein the measurement device
controls operation of each of the two or more elements, based on the timing of the inversion detected first in time, of two or more timings of the inversion detected by the two or more detection units corresponding one-to-one to the two or more elements.

(10) The measurement device according to any one of (1) to (9), wherein
the light receiving element is a single photon avalanche diode.

(11) A distance measurement device comprising:
a light receiving element that has flow of current caused by an avalanche multiplication caused according to a photon incidence while being charged to a predetermined potential and is returned to the charged state by a recharge current;
a detection unit that is configured to detect the current and invert an output signal when the current crosses a threshold value;
a delay unit that is configured to delay timing of the inversion detected by the detection unit, according to a clock;
a control unit that is configured to control an operation of the light receiving element, based on the timing of the inversion delayed by the delay unit;
a time measurement unit that is configured to measure a time period from light emission timing at which a light source emits light to light reception timing at which the light receiving element receives light to acquire a measured value;
a histogram generation unit that is configured to generate a histogram of the measured values; and
a calculation unit that is configured to calculate a distance to an object to be measured, based on the histogram.

(12) The distance measurement device according to (11), in which
the control unit
controls supply of the recharge current to the light receiving element, based on the timing of the inversion delayed by the delay unit.

(13) The distance measurement device according to (11) or (12), in which
the control unit
controls occurrence of the avalanche multiplication in the light receiving element, based on the timing of the inversion delayed by the delay unit.

(14) The distance measurement device according to any one of (11) to (13), in which
the delay unit includes:
a first delay unit that is configured to delay the timing of the inversion according to the clock; and
a second delay unit that is configured to further delay the timing of the inversion delayed by the first delay unit according to the clock, and
the control unit
controls the operation of the light receiving element based on the timing of the inversion delayed by the first delay unit and the timing of the inversion further delayed by the second delay unit.

(15) The distance measurement device according to (14), in which
the first delay unit
delays the timing of the inversion according to one of rising and falling of the clock, and
the second delay unit
further delays the timing of the inversion delayed by the first delay unit, according to the other of the rising and falling of the clock, different from the one of the rising and falling of the clock.

(16) The distance measurement device according to (14), in which
the second delay unit includes
a plurality of third delay units that are configured to further sequentially delay the timing of the inversion delayed by the first delay unit, according to the clock, and
the control unit
controls the operation of the light receiving element, based on the timing of the inversion delayed by the first delay unit and the timing of the inversion further delayed by one of the plurality of third delay units.

(17) The distance measurement device according to any one of (11) to (16) further including
a first substrate and a second substrate on which the first substrate is stacked,
in which the light receiving element is arranged on the first substrate, and
the detection unit, the delay unit, and the control unit are arranged on the second substrate.

(18) The distance measurement device according to any one of (11) to (17), in which
the light receiving element
is configured as an element array that has an arrangement of a plurality of elements on which photons are independently incident, and
the control unit
controls operation of each of the plurality of elements in common in units of two or more elements included in the plurality of elements.

(19) The distance measurement device according to (18) which controls operation of each of the two or more elements, based on the timing of the inversion detected first in time, of two or more timings of the inversion detected by the two or more detection units corresponding one-to-one to the two or more elements.

(20) The distance measurement device according to any one of (11) to (19), in which
the light receiving element is a single photon avalanche diode.

(21) An electronic device comprising:
a light source;
a light source control unit that is configured to control light emission timing at which the light source emits light;
a light receiving element that has flow of current caused by an avalanche multiplication caused according to a photon incidence while being charged to a predetermined potential and is returned to the charged state by a recharge current;
a detection unit that is configured to detect the current and invert an output signal when the current crosses a threshold value;
a delay unit that is configured to delay timing of the inversion detected by the detection unit, according to a clock;
a control unit that is configured to control an operation of the light receiving element, based on the timing of the inversion delayed by the delay unit;
a time measurement unit that is configured to measure a time period from the light emission timing to light reception timing at which the light receiving element receives light to acquire a measured value;
a histogram generation unit that is configured to generate a histogram of the measured values; and
a calculation unit that is configured to calculate a distance to an object to be measured, based on the histogram; and
a storage unit that is configured to store information indicating the distance calculated by the calculation unit.

(22) The electronic device according to (21), in which
the control unit
controls supply of the recharge current to the light receiving element, based on the timing of the inversion delayed by the delay unit.

(23) The electronic device according to (21) or (22), in which
the control unit
controls occurrence of the avalanche multiplication in the light receiving element, based on the timing of the inversion delayed by the delay unit.

(24) The electronic device according to any one of (21) to (23), in which
the delay unit includes:
a first delay unit that is configured to delay the timing of the inversion according to the clock; and
a second delay unit that is configured to further delay the timing of the inversion delayed by the first delay unit according to the clock, and
the control unit
controls the operation of the light receiving element based on the timing of the inversion delayed by the first delay unit and the timing of the inversion further delayed by the second delay unit.

(25) The electronic device according to (24), in which
the first delay unit
delays the timing of the inversion according to one of rising and falling of the clock, and
the second delay unit
further delays the timing of the inversion delayed by the first delay unit, according to the other of the rising and falling of the clock, different from the one of the rising and falling of the clock.

(26) The electronic device according to (24), in which
the second delay unit includes
a plurality of third delay units that are configured to further sequentially delay the timing of the inversion delayed by the first delay unit, according to the clock, and
the control unit
controls the operation of the light receiving element, based on the timing of the inversion delayed by the first delay unit and the timing of the inversion further delayed by one of the plurality of third delay units.

(27) The electronic device according to any one of (21) to (26) further including
a first substrate and a second substrate on which the first substrate is stacked,
in which the light receiving element is arranged on the first substrate, and
the detection unit, the delay unit, and the control unit are arranged on the second substrate.

(28) The electronic device according to any one of (21) to (27), in which
the light receiving element
is configured as an element array that has an arrangement of a plurality of elements on which photons are independently incident, and
the control unit
controls operation of each of the plurality of elements in common in units of two or more elements included in the plurality of elements.

(29) The electronic device according to (28) which
controls operation of each of the two or more elements, based on the timing of the inversion detected first in time, of two or more timings of the inversion detected by the two or more detection units corresponding one-to-one to the two or more elements.

(30) The electronic device according to any one of (21) to (29), in which
the light receiving element is a single photon avalanche diode.

(31) A measurement method comprising:
a detection step of detecting a current of a light receiving element that has flow of the current caused by an avalanche multiplication caused according to a photon incidence while being charged to a predetermined potential and is returned to the charged state by a recharge current, and inverting an output signal when the current crosses a threshold value;
a delay step of delaying timing of the inversion detected in the detection step, according to a clock; and
a control step of controlling an operation of the light receiving element, based on the timing of the inversion delayed in the delay step.

REFERENCE SIGNS LIST

1 DISTANCE MEASUREMENT DEVICE
2 LIGHT SOURCE UNIT
3 STORAGE UNIT
6 ELECTRONIC DEVICE
10, 10' PIXEL
20 LIGHT RECEIVING CHIP
21 LOGIC CHIP
100 PIXEL ARRAY UNIT
200a, 200c, 200d, 200e, 200f, 400 ELEMENT CONTROL UNIT 201a, 201c, 201d, 201e, 201f LOGIC CIRCUIT
$210_1$, $210_2$, $210_2'$, $210_3$ DELAY CIRCUIT
211, 212, 213, 1001 TRANSISTOR
410, 1002 INVERTER
1000 LIGHT RECEIVING ELEMENT
1003, 1003' QUENCHING MEANS
1004, 1004' RECHARGING MEANS
1030 OR CIRCUIT
1120 PATH
1200 LIGHT RECEIVING IC
2001, 2002 AND CIRCUIT
2003 SELECTOR
2011, 2012 NAND CIRCUIT

The invention claimed is:

1. A measurement device, comprising:
a light receiving element that has flow of current caused by an avalanche multiplication according to a photon incidence while the light receiving element is charged to a determined potential, wherein the light receiving element is returned to a charged state by a recharge current;
a detection unit configured to:
  detect the current; and
  invert an output signal in a case where the current crosses a threshold value;
a delay unit configured to delay timing of the inversion according to a clock; and
a control unit configured to control an operation of the light receiving element based on the delayed timing of the inversion.

2. The measurement device according to claim 1, wherein the control unit is further configured to control supply of the recharge current to the light receiving element based on the delayed timing of the inversion.

3. The measurement device according to claim 1, wherein the control unit is further configured to control occurrence of the avalanche multiplication in the light receiving element based on the delayed timing of the inversion.

4. The measurement device according to claim 1, wherein the delay unit includes:
  a first delay unit configured to delay the timing of the inversion according to the clock; and
  a second delay unit configured to further delay the timing of the inversion, delayed by the first delay unit, according to the clock, and
the control unit is further configured to control the operation of the light receiving element based on the timing of the inversion delayed by the first delay unit and the timing of the inversion further delayed by the second delay unit.

5. The measurement device according to claim 4, wherein the first delay unit is further configured to delay the timing of the inversion according to a first of rising or falling of the clock, and
the second delay unit further delays the timing of the inversion delayed by the first delay unit, according to a second of the rising or falling of the clock, different from the first of the rising or the falling of the clock.

6. The measurement device according to claim 4, wherein the second delay unit includes a plurality of third delay units that are configured to further sequentially delay the timing of the inversion, delayed by the first delay unit, according to the clock, and
the control unit is further configured to control the operation of the light receiving element, based on the timing of the inversion delayed by the first delay unit and the timing of the inversion further delayed by one of the plurality of third delay units.

7. The measurement device according to claim 1, further comprising a first substrate and a second substrate, wherein the first substrate is on the second substrate,
the light receiving element is on the first substrate, and
the detection unit, the delay unit, and the control unit are on the second substrate.

8. The measurement device according to claim 1, wherein the light receiving element comprises an element array that has an arrangement of a plurality of light receiving elements on which photons are independently incident, and
the control unit is further configured to control the operation of each of the plurality of light receiving elements in common in units of two or more light receiving elements of the plurality of light receiving elements.

9. The measurement device according to claim 8, wherein the measurement device is configured to control the operation of each of the two or more light receiving elements, based on the timing of the inversion detected first in time, of two or more timings of the inversion detected by two or more detection units corresponding one-to-one to the two or more light receiving elements.

10. The measurement device according to claim 1, wherein the light receiving element comprises a single photon avalanche diode.

11. A distance measurement device, comprising:
a light receiving element that has flow of current caused by an avalanche multiplication according to a photon incidence while the light receiving element is charged to a determined potential, wherein the light receiving element is returned to a charged state by a recharge current;
a detection unit configured to:
  detect the current; and
  invert an output signal in a case where the current crosses a threshold value;
a delay unit configured to delay timing of the inversion according to a clock;
a control unit configured to control an operation of the light receiving element based on the delayed timing of the inversion;
a time measurement unit configured to measure a time period from light emission timing at which a light source emits light to light reception timing at which the light receiving element receives the light to acquire a measured value;
a histogram generation unit configured to generate a histogram of a plurality of measured values including the measured value; and
a calculation unit configured to calculate a distance to an object to be measured, based on the histogram.

12. An electronic device, comprising:
a light source;
a light source control unit configured to control light emission timing at which the light source emits light;
a light receiving element that has flow of current caused by an avalanche multiplication according to a photon incidence while the light receiving element is charged to determined potential, wherein the light receiving element is returned to a charged state by a recharge current;
a detection unit configured to:
  detect the current; and
  invert an output signal in a case where the current crosses a threshold value;

a delay unit configured to delay timing of the inversion according to a clock;

a control unit configured to control an operation of the light receiving element based on the delayed timing of the inversion;

a time measurement unit configured to measure a time period from the light emission timing to light reception timing at which the light receiving element receives the light to acquire a measured value;

a histogram generation unit configured to generate a histogram of a plurality of measured values including the measured value;

a calculation unit configured to calculate a distance to an object, to be measured, based on the histogram; and a storage unit configured to store information indicating the calculated distance.

13. A measurement method, comprising:

in a measurement device detecting a current of a light receiving element, wherein the light receiving element has flow of the current caused by an avalanche multiplication according to a photon incidence while the light receiving element is charged to a determined potential, and the light receiving element is returned to a charged state by a recharge current;

inverting an output signal in a case where the current crosses a threshold value;

delaying timing of the inversion according to a clock; and controlling an operation of the light receiving element based on the delayed timing of the inversion.

* * * * *